US012812849B2

(12) United States Patent
Liu et al.

(10) Patent No.: US 12,812,849 B2
(45) Date of Patent: Nov. 24, 2026

(54) THREE-DIMENSIONAL NAND MEMORY DEVICE AND METHOD OF FORMING THE SAME

(71) Applicant: Yangtze Memory Technologies Co., Ltd., Wuhan (CN)

(72) Inventors: SiMin Liu, Wuhan (CN); Wei Xu, Wuhan (CN); Bin Yuan, Wuhan (CN); Bo Xu, Wuhan (CN); Yali Guo, Wuhan (CN); Beibei Li, Wuhan (CN); Lei Xue, Wuhan (CN); ZongLiang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 690 days.

(21) Appl. No.: 18/090,087

(22) Filed: Dec. 28, 2022

(65) Prior Publication Data

US 2024/0215231 A1 Jun. 27, 2024

(30) Foreign Application Priority Data

Dec. 21, 2022 (CN) ......................... 202211651060.0

(51) Int. Cl.

| | |
|---|---|
| ***H10B 41/27*** | (2023.01) |
| ***G11C 16/04*** | (2006.01) |
| ***H10B 41/10*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.

CPC ......... *H10B 41/27* (2023.02); *G11C 16/0483* (2013.01); *H10B 41/10* (2023.02); *H10B 41/35* (2023.02); *H10B 43/10* (2023.02); *H10B 43/27* (2023.02); *H10B 43/35* (2023.02)

(58) Field of Classification Search

CPC ........ H10B 41/27; H10B 41/10; H10B 43/35; H10B 41/35; H10B 43/10; H10B 43/27; G11C 16/0483

See application file for complete search history.

(56) References Cited

U.S. PATENT DOCUMENTS

| | | | | |
|---|---|---|---|---|
| 9,824,966 | B1 * | 11/2017 | Kanakamedala | H10B 43/27 |
| 11,114,459 | B2 * | 9/2021 | Iwai | H10B 41/27 |
| 2021/0167076 | A1 * | 6/2021 | Xu | H10B 41/10 |
| 2021/0193678 | A1 * | 6/2021 | Noh | H10B 41/10 |
| 2021/0313334 | A1 * | 10/2021 | Kobayashi | G11C 16/0483 |
| 2022/0109003 | A1 * | 4/2022 | Nagahata | H10D 64/037 |

(Continued)

*Primary Examiner* — Marlon T Fletcher
*Assistant Examiner* — Kimberly Newman Frey
(74) *Attorney, Agent, or Firm* — Oblon, McClelland, Maier & Neustadt, L.L.P.

(57) ABSTRACT

A semiconductor device includes N number of decks. Each deck includes alternating word line layers and insulating layers. Each deck includes two first gate line slit (GLS) structures and a second GLS structure positioned between the two first GLS structures. The two first GLS structures and the second GLS structures each extend in an X-Z plane and cut through the word line layers and the insulating layers of the respective deck. At least one second GLS structure of at least one deck in the Number of decks includes multiple sub-GLS structures. The multiple sub-GLS structures are separate from each other.

20 Claims, 18 Drawing Sheets

(56) References Cited

U.S. PATENT DOCUMENTS

| | | | | |
|---|---|---|---|---|
| 2023/0084615 | A1* | 3/2023 | Xie | H10W 42/121 |
| | | | | 257/314 |
| 2023/0307025 | A1* | 9/2023 | Russell | G11C 8/10 |
| 2023/0307070 | A1* | 9/2023 | Prakash | G11C 16/0483 |
| 2024/0074186 | A1* | 2/2024 | Kim | H10B 43/27 |

* cited by examiner

THREE-DIMENSIONAL NAND MEMORY DEVICE AND METHOD OF FORMING THE SAME

INCORPORATION BY REFERENCE

This present application claims the benefit of Chinese Application No. 202211651060.0, filed on Dec. 21, 2022, which is incorporated herein by reference in its entirety.

BACKGROUND

As critical dimensions of devices in integrated circuits shrink to the limits of planar memory cell technologies, designers have been looking to techniques for stacking multiple planes of memory cells to achieve a greater storage capacity and a lower cost per bit. The three-dimensional (3D) NAND memory device can include a stack of alternating insulating layers and word line layers over a substrate. Memory cell strings can be formed along a channel structure crossing the tach of alternating insulating layers and word line layers.

SUMMARY

Aspects of the disclosure provide a semiconductor device. The semiconductor device includes N number of decks that are stacked up in a Z direction and extend in parallel with an X-Y plane. N is an integer greater than 1. The X-Y plane is perpendicular to the Z direction and has an X direction and a Y direction perpendicular to the X direction. Each deck includes alternating word line layers and insulating layers. Each deck includes two first gate line slit (GIS) structures and a second GLS structure positioned between the two first GLS structures. The two first GLS structures and the second GLS structures each extend in an X-Z plane and cut through the word line layers and the insulating layers of the respective deck. At least one second GLS structure of at least one deck in the Number of decks includes multiple sub-GLS structures. The multiple sub-GLS structures are separate from each other. The second GLS structures of each deck forms a multi-deck GLS structure. The multi-deck GLS structure has a first sidewall in a first deck of the N number of decks, a second sidewall in a second deck of the N number of decks, and a third sidewall at a border between the first deck and the second deck neighboring the first deck. An upper edge of the first sidewall and a lower edge of the second sidewall are staggered. The third sidewall connects the first sidewall and the second sidewall.

In an embodiment, the second GLS structure of each deck is located in a storage region of the semiconductor device where memory cell strings each along a channel structure are positioned. In an embodiment, the second GLS structure of each deck has a same distribution pattern along the X direction, the distribution pattern being characterized by a distribution of separate sub-GLS structures included in the second GLS structure of each deck along the X direction.

In an embodiment, the second GLS structures of at least two adjacent decks among the N number of decks have different distribution patterns along the X direction, each of the different distribution patterns being characterized by a respective distribution of respective separate sub-GLS structures included in the respective second GLS structure of the at least two adjacent decks. In an embodiment, the second GLS structures of at least two adjacent decks among the N number of decks have a same distribution pattern along the X direction.

In an embodiment, the second GLS structures of at least two nonadjacent decks among the N number of decks have a same distribution pattern along the X direction. In an embodiment, the second GLS structures of any two adjacent decks among the N number of decks have different distribution patterns along the X direction.

In an embodiment, the two first GLS structures of the N number of decks define a block structure between the two first GLS structures of the N number of decks, and the second GLS structures of the N number of decks define a border between two finger structures in the block structure. In an embodiment, a width at a top of a lower one of two neighboring second GLS structures of two neighboring decks is smaller than a width at a bottom of an upper one of the two neighboring second GLS structures of the two neighboring decks in a cross-section corresponding to a Y-Z plane passing the multi-deck GLS structure.

In an embodiment, a width at a top of a lower one of two neighboring second GLS structures of two neighboring decks is larger than a width at a bottom of an upper one of the two neighboring second GLS structures of the two neighboring decks in a cross-section corresponding to a Y-Z plane passing the multi-deck GLS structure. In an embodiment, two second GLS structures of two adjacent decks among the N number of decks have a first distribution pattern and a second distribution, respectively, along the X direction, the first distribution including sub-GLS structures separate at first positions, the second distribution including sub-GLS structures separate at second positions, the first positions and the second positions being staggered.

Aspects of the disclosure provide a method of manufacturing a semiconductor device. The method can include forming, one deck by one deck, N number of decks that are stacked up in a Z direction. N is an integer greater than 1. Each deck extends in parallel with an X-Y plane that is perpendicular to the Z direction and has an X direction and a Y direction perpendicular to the X direction. Each deck includes alternating sacrificial layers and insulating layers. The forming of each of the N number of decks includes forming two first gate slit (GLS) openings and a second GLS opening positioned between the two first GLS opening. The two first GLS openings and the second GLS opening each extend in an X-Z plane, and cut through the sacrificial layers and the insulating layers of the respective deck. At least one second GLS opening of at least one deck in the Number of decks including multiple sub-GLS openings. The multiple sub-GLS openings are separate from each other.

In an embodiment, the second GLS opening of each deck is located in a storage region of the semiconductor device where memory cell strings each along a channel structure are formed. In an embodiment, the second GLS opening of each deck has a same distribution pattern along the X direction, the distribution pattern being characterized by a distribution of separate sub-GLS openings included in the second GLS opening of each deck along the X direction.

In an embodiment, the second GLS openings of at least two adjacent decks among the N number of decks have different distribution patterns along the X direction, each of the different distribution patterns being characterized by a respective distribution of respective separate sub-GLS openings included in the respective second GLS opening of the at least two adjacent decks. In an embodiment, the second GLS openings of at least two adjacent decks among the N number of decks have a same distribution pattern along the X direction.

In an embodiment, the second GLS openings of at least two nonadjacent decks among the N number of decks have a same distribution pattern along the X direction. In an embodiment, the second GLS openings of any two adjacent decks among the N number of decks have different distribution patterns along the X direction. In an embodiment, the two first GLS openings of the N number of decks define a block structure between the two first GLS openings of the N number of decks, and the second GLS openings of the N number of decks define a border between two finger structures in the block structure.

In an embodiment, the two GLS openings and the second GLS opening of a first deck among the N number of decks is formed before the forming of a second deck positioned on top of the first deck. In an embodiment, for the N number of decks except the last deck, the forming of the two first GLS openings and the second GLS opening in the respective deck includes forming per-deck channel holes, the two first GLS openings, and the second GLS opening in the respective deck during a same etch process.

Aspects of the disclosure provide a memory system. The memory system includes a controller, interface circuitry for connecting the controller to a host device, and a memory device connected to the controller. The memory device includes N number of decks that are stacked up in a 2 direction and extend in parallel with an X-Y plane. N is an integer greater than 1. The X-Y plane is perpendicular to the Z direction and has an X direction and a Y direction perpendicular to the X direction. Each deck includes alternating word line layers and insulating layers. Each deck includes two first gate line slit (GLS) structures and a second GLS structure positioned between the two first GLS structures. The two first GLS structures and the second GLS structures each extend in an X-Z plane and cut through the word line layers and the insulating layers of the respective deck. At least one second GLS structure of at least one deck in the N umber of decks includes multiple sub-GLS structures. The multiple sub-GLS structures are separate from each other. The second GLS structures of each deck forms a multi-deck GLS structure. The multi-deck GLS structure has a first sidewall in a first deck of the N number of decks, a second sidewall in a second deck of the N number of decks, and a third sidewall at a border between the first deck and the second deck neighboring the first deck. An upper edge of the first sidewall and a lower edge of the second sidewall are staggered. The third sidewall connects the first sidewall and the second sidewall.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. The dimensions of the various features may be increased or reduced for clarity of discussion.

DETAILED DESCRIPTION

Figure 1A:
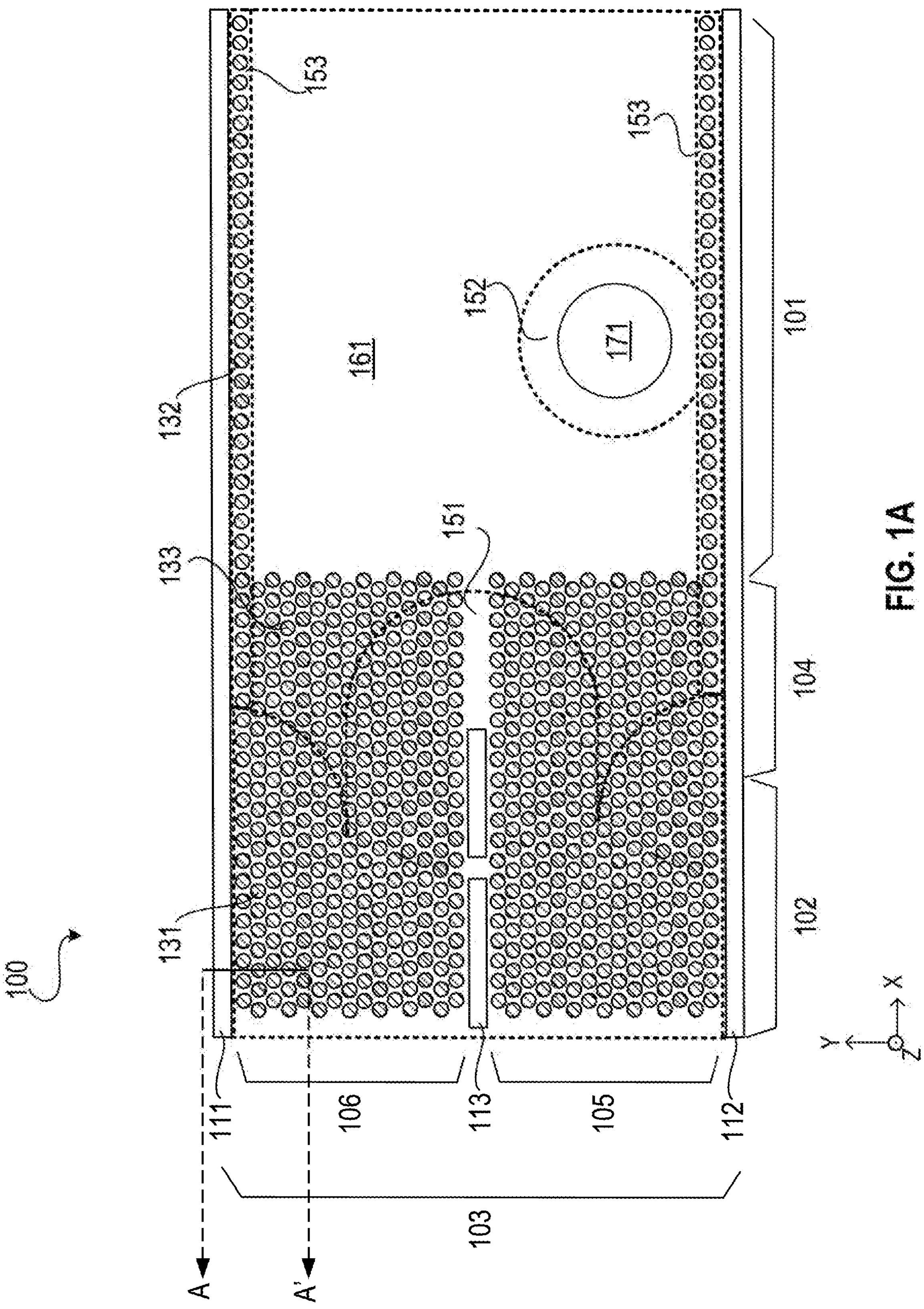
FIG. 1A shows a top view of a block 103 of a 3D NAND memory device 100 according to some embodiments of the disclosure.

The following disclosure provides many different embodiments, or examples, for implementing various features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) NAND memory device includes stacked word line layers for controlling vertically arranged memory cells. The number of word line layers can increase from dozens of layers to hundreds of layers to achieve a higher bit density. Accordingly, forming a gate line slit (GLS) passing the whole stacking layers by a single etch process (one-etch GLS method) becomes more and more challenging. For example, the bottom of a GLS may not be fully opened. A GLS may twist along the X direction. A vertical profile of a GLS may show notched (sometimes known as "mouse bite") or tilt sidewalls.

The present disclosure describes techniques for solving the above problem during a fabrication process. 3D NAND memory devices with many stacking layers (e.g., more than one hundred layers) can employ a multi-deck configuration (or N-deck configuration) where channel structures are formed deck by deck. GLSs can be formed deck by deck (multi-etch GLS method). In this way, forming a single GLS through the whole stacking layers in a single etch process can be replaced with separately forming multiple per-deck GLSs each through a deck of stacking layers. The etch process becomes easier and the shapes of the GLSs become more controllable due to the reduced tech depth.

In some embodiments, formation of the GLSs and the channel structures in a deck can be merged to save processing costs. For example, the construction of the GLSs and the channel structures can share a same lithography mask and use a same etch process. In some embodiments, formation of the GLSs and the channel structures in a deck can be done using different etch processes, for example, when the GLSs and the channel structures may cross different layers of materials.

Another problem arises when the number of stacking layers increases. GLSs can be formed to partition a body of a 3D NAND memory device into blocks and partition the blocks into fingers (or figure structures). The fingers extend in the X direction and have a very high height-to-width aspect ratio in a cross-section passing a Y-Z plane. Structural stresses generated from fabrication processes can cause the figures to twist and tilt. As the number of stacking layers increases, such effects become severe and can damage the internal structures of the memory device. Separately forming the per-deck GLSs provides the flexibility of applying different per-deck GLS distribution patterns (e.g., arrangement of the GLSs in the X-Y plane) at each deck. The combination of these per-deck GLS distribution patterns provides structure-enhancement solutions to mitigate the stress-caused damaging effects.

FIG. 1A shows a top view of a block 103 of a 3D NAND memory device 100 according to some embodiments of the disclosure. A 3D coordinate system is used in FIG. 1A and other figures in the present disclosure as a reference for describing the structures of the device 100. The 3D coordinate system has three mutually perpendicular coordinate axes: the x-axis, the y-axis, and the z-axis corresponding to an X direction, a Y direction, and a Z direction, respectively.

The block 103 is bounded by two gate line slits (GLSs) 111-112 (referred to as block-partition GLSs). The block-partition GLSs 111-112 extend in the X direction in the top view of FIG. 1A. The device 100 includes alternating word line layers and insulating layers (not shown) that extend in parallel with an X-Y plane and stack in the Z direction. The block-partition GLSs 111-112 can each extend in an X-Z plane and cut through the stacking layers to define the block 103. The device 100 can be partitioned by any number of block-partition GLSs each extending in a respective X-Z plane, resulting in any number of blocks. The block 103 can be one of these blocks.

It is noted that the term GLS may be used to refer to different structures in the present disclosure depending on the context where the term is used. In a first case, the term can refer to a slit resulting from an etching process with or without additional layers formed on the sidewalls of the slit. In a second case, the term can also refer to a structure that is bounded within a slit and formed by filling one or more materials into the slit. In the context of describing the structures of a memory device that is a product of a manufacturing process, the term GLS structure can be used exchangeably with the term GLS to mean a structure that is formed within a slit (the meaning of the second case).

The block 103 further includes a sequence of GLSs 113 (referred to as finger-partition GLSs). The sequence of finger-partition GLSs 113 is distributed along the X direction in the top view of FIG. 1A. Each finger-partition GLS cuts through the stacking layers in the Z direction. Consequently, the block 103 is partitioned into two fingers 105-106. In various embodiments, the block 103 can include any number of finger-partition GLS sequences. Each finger-partition GLS sequence can include any number of GLSs. In some examples, a sequence of finger-partition GLSs can cross a block from the left side to the right side in the X direction.

The block 103 includes several regions: a contact region 101, a storage region 102, and a transition region 104 between the contact region 101 and the storage region 102, as shown in FIG. 1A. The storage region 102 (also referred to as a core region or an array region) includes channel structures 131. The channel structures 131 are vertically (in the Z direction) formed and cross the stacking word line layers. A memory cell transistor is formed at each position where a channel structure crosses a word line layer. A memory cell string is thus formed along each channel structure in the Z direction. The transition region 104 includes dummy channel structures 133. The contact region 101 includes dummy channel structures 132.

The contact region 101 includes vertically (in the Z direction) formed word line contacts 171. Each word line contact 171 can reach a respective word line layer (referred to as a target word line layer for a specific word line contact) at the bottom of the word line contact. While one word line contact 171 is shown in FIG. 1A, there can be any number of word line contacts formed in the contact region to provide a contact line to respective word line layers.

In the FIG. 1A example, each word line layer can extend in an X-Y plane to cover the three regions 101/104/102 in the block 103. No staircase structures are formed in the block 103.

Each word line layer can include different areas that may include different materials, be formed by different processes, and serve for different purposes. A layout of a particular word line layer (referred to as a first word line layer below) is shown in FIG. 1A as an example. As shown, the first word line layer can include areas 151/152/153/161 (also can be referred to as portions, regions, or layers). For example, a stack of alternating sacrificial layers and insulating layers can be formed at that early stage. Each sacrificial layer can later be partially replaced with a layer of conductive material and become a word line layer, such as the first word line layer. In the first word line layer, the areas 151/152/153 can be portions where the sacrificial layer has been replaced with a conductive material. The area 161 can be a portion where the original sacrificial remains. The area 161 can be considered as a sacrificial area or a sacrificial layer within the first word line layer.

The conductive area 153 of the first word line layer provides a connection (via the area 152) between the word line contact 171 and the area 151. The conductive area 152 provides a connection between the word line contact 171 and the area 153. The conductive area 151 serves as a gate electrode and is in connection with memory cells in the first word line layer. In this manner, the memory cells can be connected with respective word lines formed on top of the memory device 100.

For different word line layers in the block 103, the word line contacts can be distributed at different locations seen from the top view. Accordingly, a conductive region (similar to the area 152) near each word line contact can have different locations in the respective target word line layer seen from the top view. Each word line contact can extend from the respective target word line layer upwards (along the Z direction) to connect to a word line disposed on top of the block 103. Each word line contact can cross the word line layers above the target word line layer to reach the respective word line. The position for a word line contact to cross a word line layer can be within a sacrificial layer (an area similar to the sacrificial layer 161 (area 161) in the first word line layer) of this word line layer the word line contact crossed.

In the transition region 104, as shown in FIG. 1A, the first word line layer (and other word line layers in the block 103) transitions from the conductive area 151 to the sacrificial area 161. In some examples, this transition may introduce mechanical stress in the transition region 104. Thus, channel structures may be damaged and cannot function properly.

In other examples, different from the FIG. 1A example, staircase structures are used in the contact region 101 in the device 100. In such a configuration, the contact region 101 can be referred to as a staircase region 101. For example, the staircase region 101 includes a staircase structure (not shown). The staircase structure includes a sequence(s) of steps formed by edges of respective word line layers. The steps go down the X direction for example. Word line contacts and dummy channels can be formed in the staircase region 101. The word line contacts can be in contact with each respective word line layer at the respective step. The dummy channels can cross the stacking layers to provide support to the structure of the device 100.

Figure 1B:
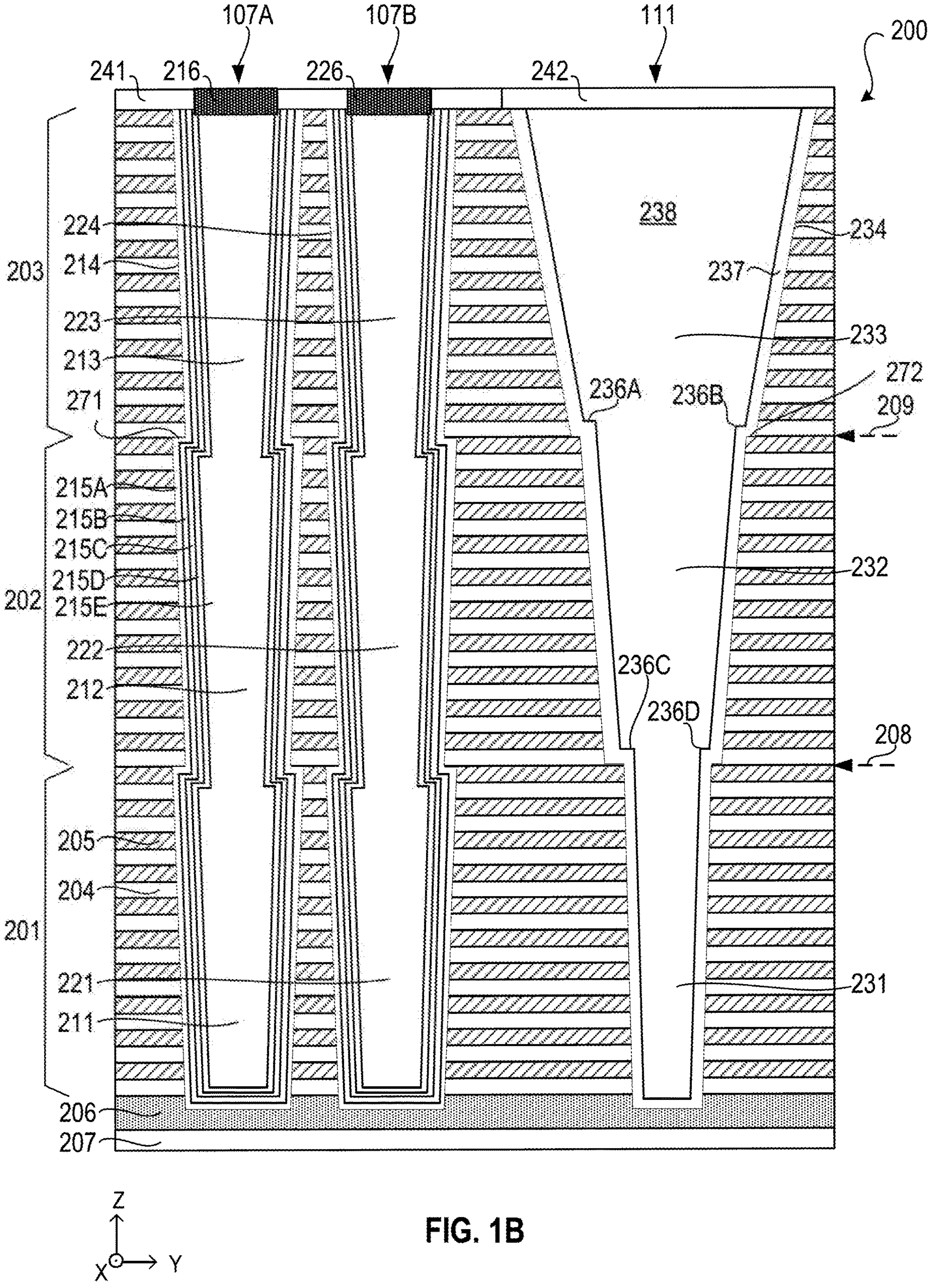
FIG. 1B shows a cross-sectional view (or a cross-section) 200 of the block 103 of the device 100 according to embodiments of the disclosure.

FIG. 1B shows a cross-sectional view (or a cross-section) 200 of the block 103 of the device 100 according to embodiments of the disclosure. The cross-sectional view 200 corresponds to a Y-Z plane passing cutline A-A' shown in FIG. 1A. The device 100 can be made using an N-deck fabrication process where N number of decks are formed deck by deck. N can be an integer greater than 1. As an example, the block 103 is shown to include three decks 201-203 stacking up in the Z direction.

Each deck 201-203 includes stacking layers of word line layers 204 and insulating layers 205 alternatively arranged in the Z direction. The word line layers 204 include conductive materials, such as metals, polysilicon, and the like. The insulating layers 205 include non-conductive materials. A source line layer 206 is disposed at the bottom of the lower deck 201 and above a substrate 207. The source line layer 206 can include a conductive material(s) and serves as a source line for the channel structures 131 in the storage region 102 shown in FIG. 1A.

Two channel structures 107A-107B are shown in the cross-sectional view 200 of FIG. 1B. Each channel structure 107A-107B includes multiple segments (sub-channel structures) connected in series in the Z direction. The channel structure 107A includes three sub-channel structures: a first-deck channel structure 211, a second-deck channel structure 212, and a third-deck channel structure 213, corresponding to the lower deck 201, the middle deck 202, and the upper deck 203, respectively. Similarly, the channel structure 107B includes three sub-channel structures: a first-deck channel structure 221, a second-deck channel structure 222, and a third-deck channel structure 223, corresponding to the lower deck 201, the middle deck 202, and the upper deck 203, respectively.

As shown, the profile of a sidewall 214 or 224 of the channel structure 107A or 107B has a discontinuous shape. For example, the profile of the sidewall 214 or 224 is discontinuous at borders between any two adjacent or neighboring decks among the decks 201-203 (the border 208 between the decks 201-202 and the border 209 between the decks 202-203). For example, for the sidewall 214, at the border 209, a lower edge of a first portion of the sidewall 214 in the deck 203 and an upper edge of a second portion of the sidewall 214 in the deck 202 are staggered along the Y direction. The two edges (or the two portions of the sidewall 214) are connected by a portion 271 of the sidewall 214. The portion 271 of the sidewall 214 can extend in the X-Y plane in some examples. In other examples, the portion 271 of the sidewall 214 can slope with respect to the X-Y plane. Within each deck, the profile of the sidewall 214 or 224 of the channel structure 107A or 107B has a continuous shape. Accordingly, in some examples, boundaries of neighboring decks in the device 100 can be defined or determined according to the locations where two neighboring sub-channel structures meet and the sidewalls of the two neighboring sub-channel structures are staggered or discontinuous.

In an embodiment, the lower sub-channel structures 211/221 cross the stacking layers of the bottom deck 201 and reach the source line layer 206. The middle sub-channel structures 212/222 cross the stacking layers of the middle deck 202. The upper sub-channel structures 213/223 cross the stacking layers of the upper deck 203. In an embodiment, a cap layer 241 is disposed over the top of the upper deck 203. Channel contacts 216/226 are disposed at the tops of the channel structures 107A/107B and pass through the cap layer 241.

In an embodiment, each of the channel structures 107A/107B further includes a core 215E, a channel layer 215D that surrounds the core 215E, a tunneling layer 215C that surrounds the channel layer 215D, a charge trapping layer 215B that surrounds the tunneling layer 215C, and a barrier layer 215A that surrounds the charge trapping layer 215B and further is in direct contact to the word line layers 204. In some embodiments, a high-K layer, such as $HfO_2$ or AlO, can be disposed between the word line layers 204 and the barrier layer 215A. Those layers 215A, 215B. 215C, and 215D and a corresponding word line layer together form a structure of a memory cell in a respective memory cell string.

In some embodiments, one or more top gate selection (TGS) transistors can be formed at the top word line layers of the upper deck 203 at each channel structure 107A/107B; and one or more bottom gate selection (BGS) transistors can be formed at the bottom word line layers of the bottom deck 201 at each channel structure 107A/107B. In some examples, for those TGS transistors or BGS transistors, the barrier layer 215A, the charge trapping layer 215B, and the tunneling layer 215C in a memory cell transistor may be replaced with, for example, a gate oxide layer.

The GLS 111 is shown in the cross-sectional view 200 in FIG. 1B. The GLS 111 cuts through the staking layers of the three decks 201-203 in an X-Z plane. In the cross-sectional view 200, the GLS 111 includes three segments (referred to as per-deck GLS or sub-GLSs) 231-233: a bottom-deck sub-GLS 231, a middle-deck sub-GLS 232, and an upper-deck sub-GLS 233, corresponding to the decks 201-203, respectively. The bottom-deck sub-GLS 231 crosses the stacking layers of the bottom deck 201 and reaches the source line layer 206. The middle-deck sub-GLS 232 crosses the stacking layers of the middle deck 202. The upper-deck sub-GLS 233 crosses the stacking layers of the upper deck 203 and is covered by a cap layer 242. The three sub-GLSs 231-233 are connected in series in the Z direction.

In the N-deck fabrication process, the sub-GLSs 231-233 can be formed one deck by one deck using separate etching processes at different stages of the fabrication process. As a result, a profile of a sidewall 234 of the GLS 111 in the cross-sectional view 200 has a discontinuous shape. For example, the sidewall 234 is discontinuous at positions 236A-236B located at the deck boundary (or border) 209 between the upper deck 203 and the middle deck 202 and positions 236C and 236D located at the deck boundary (boarder) 208 between the middle deck 202 and the lower deck 201. For example, a lower edge of a first sidewall (a first portion of the sidewall 234) of the sub-GLS232 and an upper edge of a second sidewall (a second portion of the sidewall 234) of the sub-GLS 233 can be staggered at the border 209 near the position 236B. A third sidewall 272 (a third portion of the sidewall 234) can exist at the border 209 and connect the lower edge and the upper edge. The third sidewall 272 can extend in the X-Y plane in the FIG. 1B example. In other examples, the third sidewall 272 may slope with respect to the X-Y plane.

For the GLS 111, each sub-GLS 231/232/233 can have a wider top width and a narrower bottom width. In addition, a bottom width of an upper sub-GLS can be broader than or equal to a top width of an adjacent lower sub-GLS. Also, in some examples, an upper sub-GLS can have a relatively smaller sidewall slope than a lower adjacent sub-GLS. As a result, the GLS 111, as a whole, can have a small B/T ratio (that is a ratio of the bottom width to the top width). Such a GLS shape makes it easier to fill the GLS 111 and makes the GLS 111 a stronger support structure to counter the adverse effects of mechanical stress inside the memory device 100.

In some examples, the GLS 111 does not provide a circuit path from the top side (front side) to the bottom side (back side) and thus can be isolated from surrounding structures or materials. In an example, a layer 237 of dielectric material (e.g., SiO2) can be formed on the sidewalls and the bottom of the GLS 111. Polysilicon 238 can then be filled in the spaces within the GLS 111. In some examples, the GLS 111 provides a circuit path for connection to the source line layer 206. An isolation layer can be formed on the sidewalls of the GLS 111, and a conductive material (e.g., a metal) can be filled in the spaces within the GLS 111.

It is noted that the sequence of the finger-partition GLSs 113 in FIG. 1A can have a similar structure to the block-partition GLS 111. Also, the finger-partition GLSs can be formed using processing processes similar to those for making the block-partition GLS 111.

In various embodiments, the 3D NAND device 100 can include any number of decks, such as 2, 4, 6, or the like. Accordingly, the channel structures 107A/107B and the GLS 111 can include any number of segments corresponding to respective decks. In addition, due to different designs and fabrication processes taken, the profiles of the GLS 111 or the channel structures 107A/107B can have different shapes than the profiles shown in FIG. 1B or FIG. 1C.

In some embodiments, a segment of the channel structures 107A/107B or the GLS 111 may be formed using a single etch process but crossing more than one decks (such as 2, 3, or more decks). Those segments included in one channel structure or one GLS can each cross different number of decks. Those segments with different depths (measured by a number of decks) can be arranged in any order in different examples. For example, each of the three segments 231-233 (more than three segments in some examples) may cross 1, 2, 3, or any number of decks. Those segments of a same GLS or GIS structure may cross different numbers of decks.

Figure 1C:
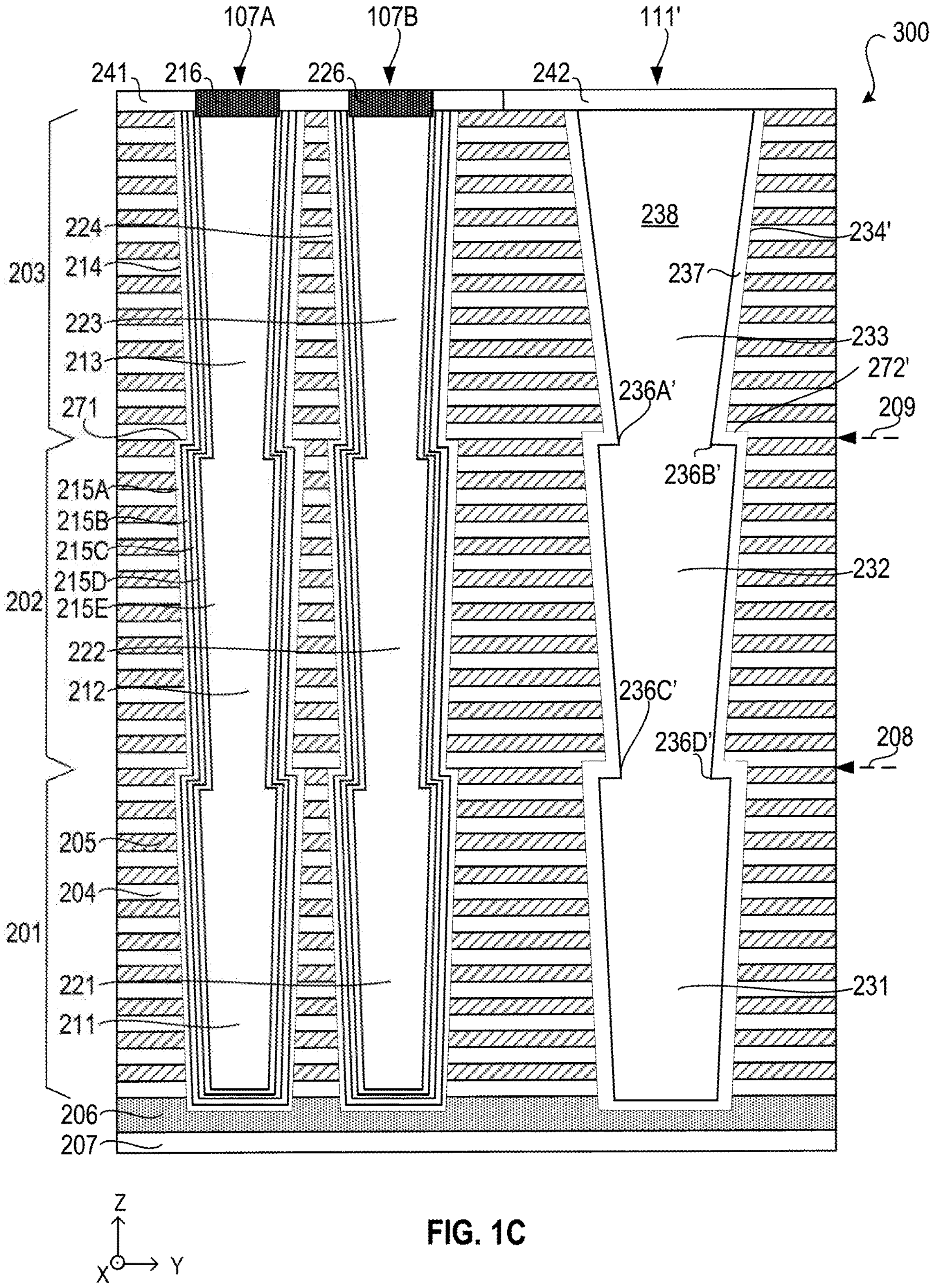
FIG. 1C shows another example of the GLS 111 of the device 100 in a cross-sectional view 300 according to embodiments of the disclosure.

FIG. 1C shows another example of the GLS 111 of the device 100 in a cross-sectional view 300 according to embodiments of the disclosure. The GLS 111 can have a structure similar to that of a GLS 111' shown in FIG. 1C. For the GLS 111', each sub-GLS 231/232/233 can have a wider top width and a narrower bottom width. In addition, a bottom width of an upper sub-GLS can be narrower than or equal to a top width of an adjacent lower sub-GLS. Also, in some examples, an upper sub-GLS can have a similar sidewall slope as a lower adjacent sub-GLS.

In FIG. 1C, a profile of a sidewall 234' of the GLS 111' in the cross-sectional view 300 has a discontinuous shape. For example, the sidewall 234' is discontinuous at positions 236A'-236B' located at the deck boundary (or border) 209 between the upper deck 203 and the middle deck 202 and positions 236C' and 236D' located at the deck boundary (border) 208 between the middle deck 202 and the lower deck 201. For example, a lower edge of a first sidewall (a first portion of the sidewall 234') of the sub-GLS232 and an upper edge of a second sidewall (a second portion of the sidewall 234') of the sub-GLS 233 can be staggered at the border 209 near the position 236B'. A third sidewall 272' (a third portion of the sidewall 234') can exist at the border 209 and connect the lower edge and the upper edge. The third sidewall 272' can extend in the X-Y plane in the FIG. 1B example. In other examples, the third sidewall 272' may slope with respect to the X-Y plane.

As an example, a fabrication process for making the device 100 is described below with reference to FIGS. 2-7. The FIGS. 2-7 each show a cross-sectional view of the block 103 at an intermediate stage of the fabrication process. The cross-sectional views correspond to a cut plane passing the cut line A-A' in FIG. 1A.

Figure 2:
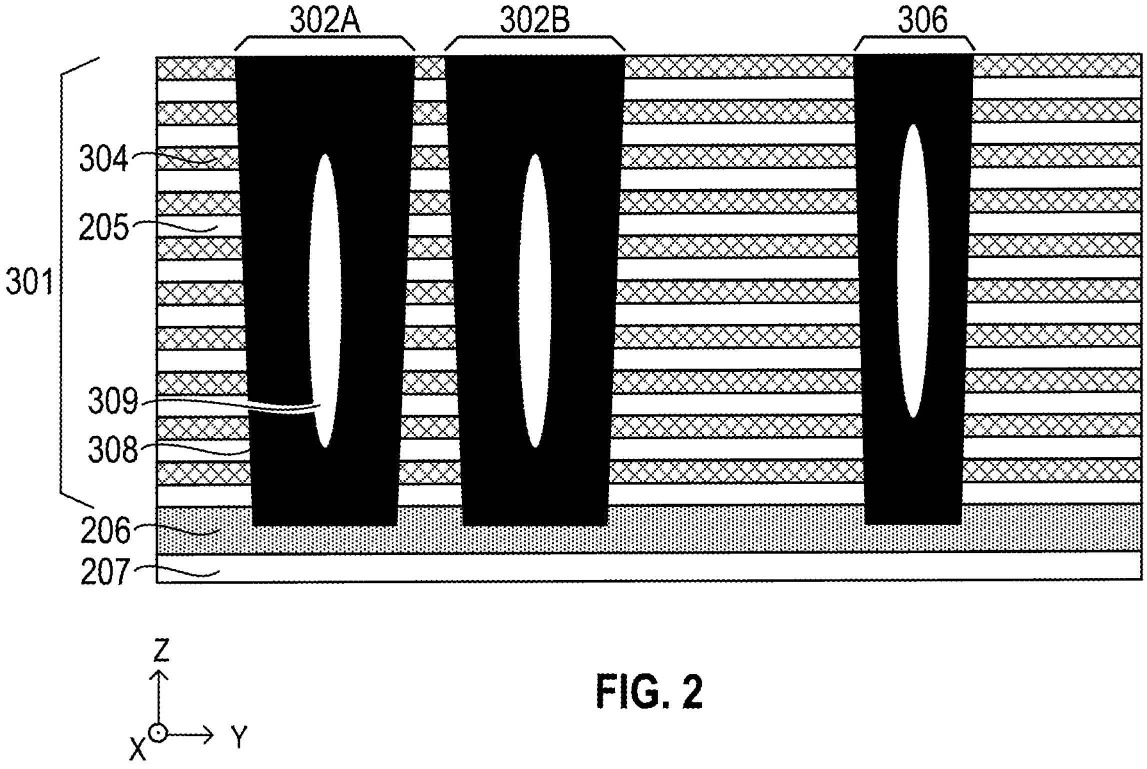
FIGS. 2-7 are cross-sectional views of various intermediate steps of manufacturing the 3D NAND memory device 100 according to embodiments of the disclosure.

In FIG. 2, the source line layer 206 can be formed over the substrate 207. The substrate 207 can be any suitable substrate and can be processed to form various suitable features. The substrate 207 can be formed of any suitable semiconductor material, such as silicon (Si), germanium (Ge), SiGe, a compound semiconductor, an alloy semiconductor, and the like. The substrate 207 can include various layers, including conductive or insulating layers formed on a semiconductor substrate. The substrate 207 can include various doping configurations depending on design requirements. In some embodiments, the source line layer 206 can be a conductive layer (e.g., polysilicon) deposited over the substrate 207. In some embodiments, the source line layer 206 can be part of the substrate 207.

A deck 301 of stacking layers of alternating sacrificial layers 304 and insulating layer 205 is formed over the source line layer 206. The deck 301 corresponds to the bottom deck 201 in the FIG. 1B example. In a later stage, the sacrificial layers 304 can be replaced with the word line layers 204. For example, the sacrificial layers 304 can include silicon nitride, and the insulating layers 205 can include a dielectric material, such as SiO2.

The deck 301 can include any number of stacking layers (sacrificial layers 304 and insulating layers 205), such 128, 256, or 1024 sacrificial layers. The sacrificial layers 304 and the insulating layers 205 can have any suitable thickness. The sacrificial layers 304 and the insulating layers 205 can be formed using chemical vapor deposition (CVD), physical vapor deposition (PVD), atomic layer deposition (ALD), and the like.

Channel openings 302A and 302B corresponding to the sub-channel structures 211 and 221 in FIG. 1B and a GLS opening 306 corresponding to the sub-GLS 231 can be formed subsequently.

It is noted that the openings 302A/302B/306 are formed in the deck 301 before a next deck is formed on top of the deck 301. In conventional methods, GLSs are formed after all decks have been formed. Due to the very large number of stacking layers of all the decks, a GLS formed in a single etch process may not cut through the stacking layers at the bottom of the stacked decks. Or, the bottom portion of a GLS may become twisted along the X direction and sidewalls of the GLS may tilt and has mouse bites. In contrast, the present disclosure provides a method for forming a multi-deck GLS in a deck-by-deck manner. The multi-deck GLS can include multiple portions (sub-GLSs) arranged vertically. Each portion is formed by etching a single deck. Due to the reduced etch depth of the sub-GLS, the shape of the vertical profile of a sub-GLS can be better controlled. As a result, the structure of the memory device 100 close to the GLS can be protected from being damaged because of deformation of the GLS.

In addition, in some embodiments, the openings 302A/302B/306 are formed during a same process (for example, a same etching process). Merging the formation of the openings 302A/302B/306 into one etch process can lower the manufacturing cost compared with forming the GLS opening 306 separately from the channel openings 302A/302B. In some other embodiments, the channel openings 302A/302B and the GLS opening 306 can be formed independently, for example, using two separate etching processes.

To form the openings 302A/302B/306, in an example, a mask layer (not shown) is formed over the deck 301. The mask layer is patterned using a lithography process to define locations of the openings 302A/302B/306. Based on the patterned mask layer, the openings 302A/302B/306 are formed using an etching process, such as a wet etching, a dry etching (e.g., a plasma etch referred to as a plasma punch), or a combination thereof.

The channel openings 302A/302B can have any suitable shape, such as a circular pillar-shape, a square pillar-shape, an oval pillar-shape, and the like. In an embodiment, the openings 302A/302B have a tapered profile where a top opening size is larger than a bottom opening size, as shown in FIG. 2. In an embodiment, the profile of the GLS opening 306 in the cross-sectional view of FIG. 2 has a tapered profile where a top opening size (top width) is larger than a bottom opening size (bottom width), as shown in FIG. 2.

A sacrificial layer (or core) 308 is formed to fill each of the openings 302A/302B/306. The sacrificial layer 308 can be deposited over the surface of the sidewalls of each opening 302A/302B/306. The sacrificial layer 308 can be formed using any suitable process, such as an ALD process, a CVD process, a PVD process, or a combination thereof. The sacrificial layer 308 can include one or more sacrificial materials. In various embodiments, the sacrificial layer 308 includes carbon, silicon (e.g., polysilicon), metal (e.g., tungsten), and/or the like. In an embodiment, an air void 309 is formed within the respective sacrificial layer 308.

A surface planarization process (e.g., a chemical mechanical planarization (CMP)) can be used to remove excessive materials of the mask layer and the sacrificial layer 308 from the top surface of the deck 301.

Figure 3:
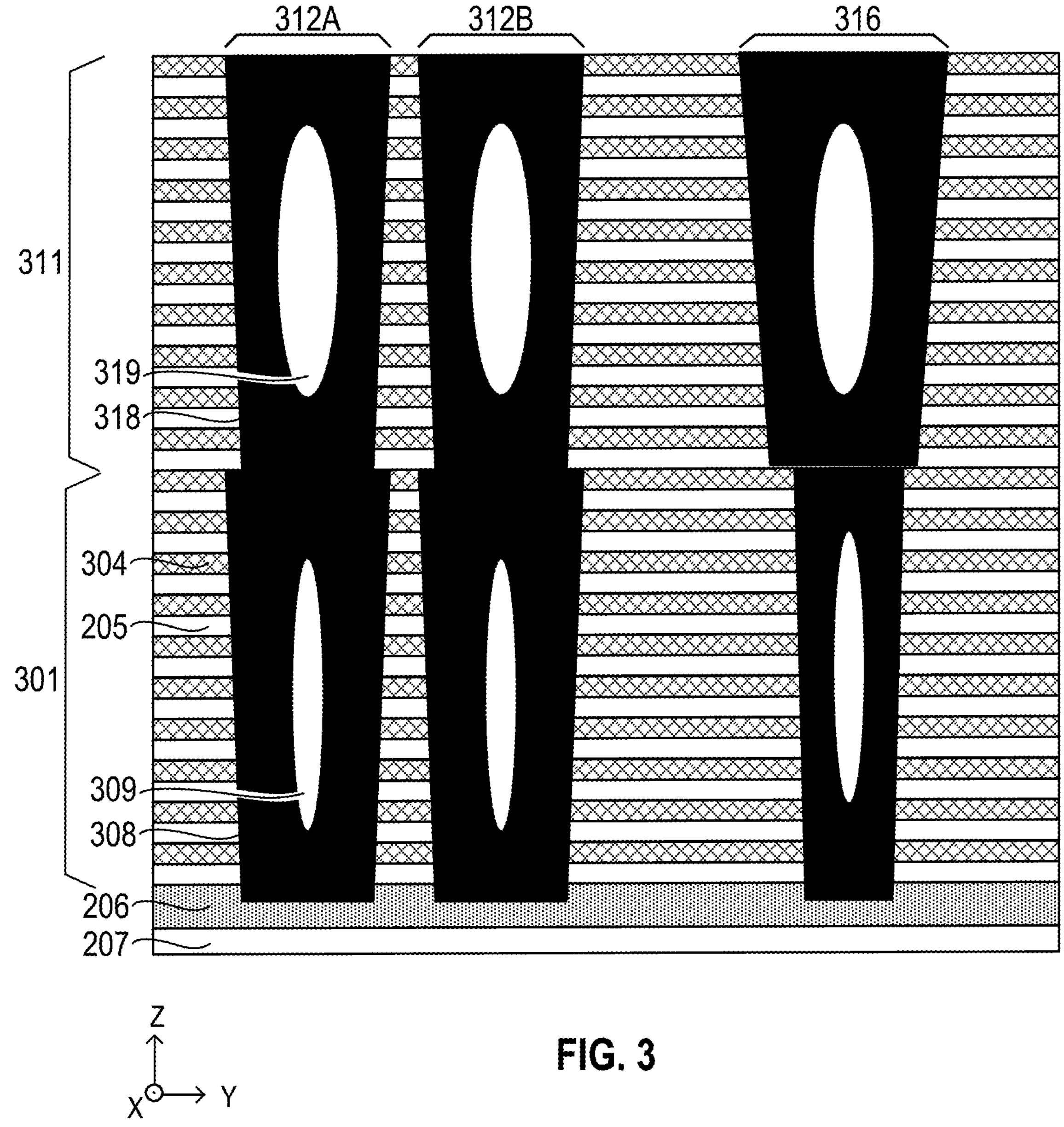

In FIG. 3, a second deck 311 is formed over the first deck 301. The second deck 311 can have structures similar to the first deck 301 and be formed in a way similar to the first deck 301. The second deck 311 can include a same number or different number of stacking layers as the first deck 301.

Channel openings 312A and 312B and a GLS opening 316 can be formed in the second deck 311 in a same processing process. A same lithography mask can be shared for the formation of the openings 302A/302B/306. The openings 312A/312B/316 can be formed in a way similar to the openings 302A/302B/306. In an embodiment, the bottoms of the openings 312A/312B/316 are positioned at the top surfaces of the sacrificial layers 308 of the openings 302A/302B/306.

A sacrificial layer 318 and an air void 319 can be formed in each of the openings 312A/312B/316 in a way similar to the sacrificial layer 308 and the air void 309 in the first deck 201.

Figure 4:
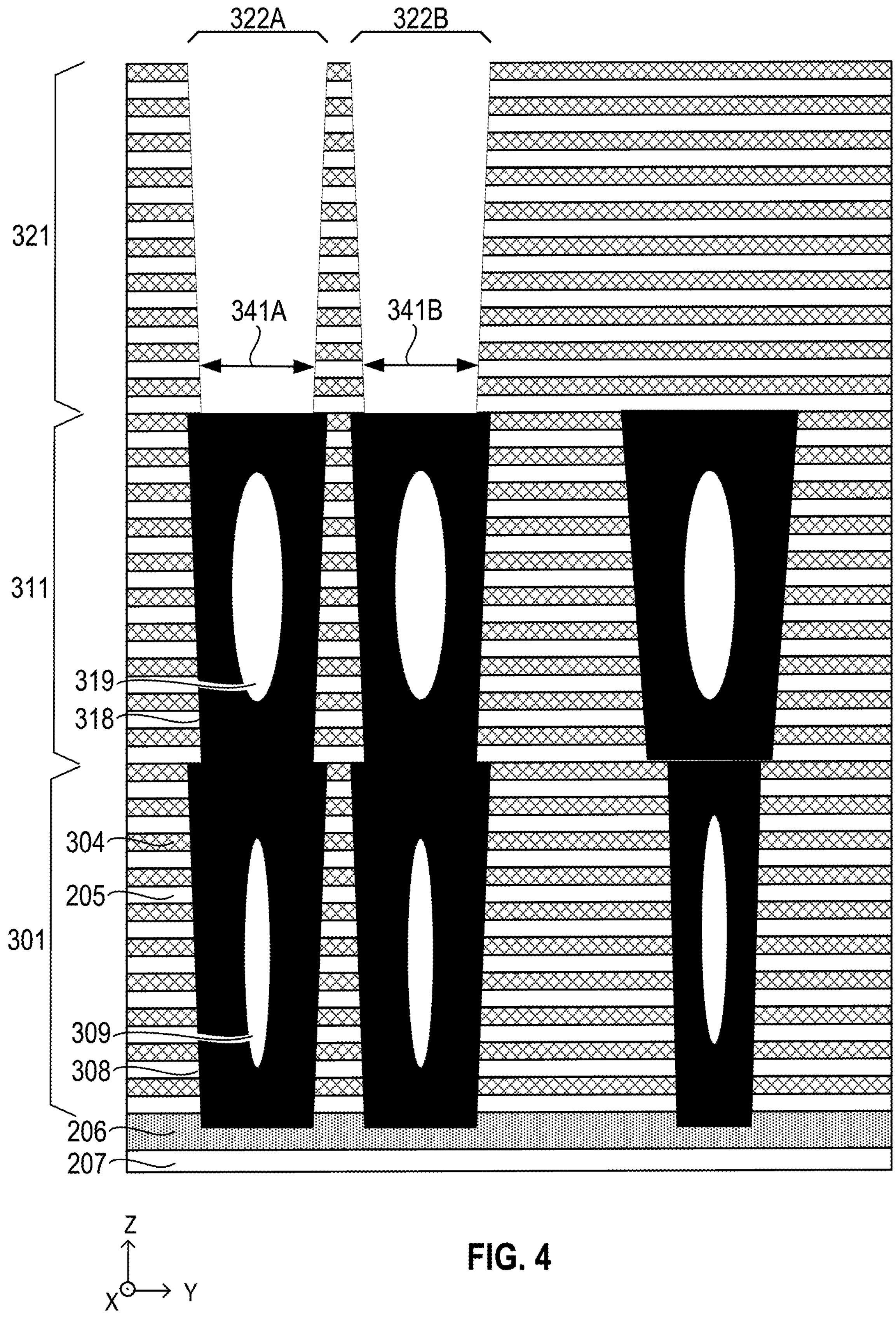

In FIG. 4, a third deck 321 is formed over the second deck 311. The third deck 321 can have structures similar to the first deck 301 and the second deck 311. The third deck 321 can be formed in a way similar to the first deck 301 and the second deck 311. The third deck 321 can include a same number or a different number of stacking layers as the first deck 301 or the second deck 311.

Channel openings 322A and 322B can be formed in the third deck 321. No GLS opening is formed at the current stage. The openings 322A/322B can be formed in a way similar to the openings 312A/312B. In an embodiment, the bottoms of the openings 322A/322B are positioned at the top surfaces of the sacrificial layers 318 in the openings 312A/312B.

By performing a suitable processing process, the sacrificial layer 318 can be removed from the openings 312A/312B (shown in FIG. 3), and the sacrificial layer 308 can be removed from the openings 302A/302B (shown in FIG. 2). In an example, the sacrificial layers 318 and 308 are formed using carbon. Dioxide gas is used to burn out the carbon to remove the sacrificial layers 318 and 308. As a result, sidewalls of the channel openings 302A/302B, 312A/312B, and 322A/322B can be exposed.

At the current stage, the channel openings 302A/302B. 312A/312B, and 322A/322B, connected in series in the Z direction, form two multi-deck channel openings: a left-side opening 341A including the channel openings 302A, 312A, and 322A, and a right-side opening 341B including the channel openings 302B, 312B, and 322B. A wet clean process can further be performed to clean the surface of the stacking layers of the decks 301/311/321 exposed in the openings 341A/341B.

Figure 5:
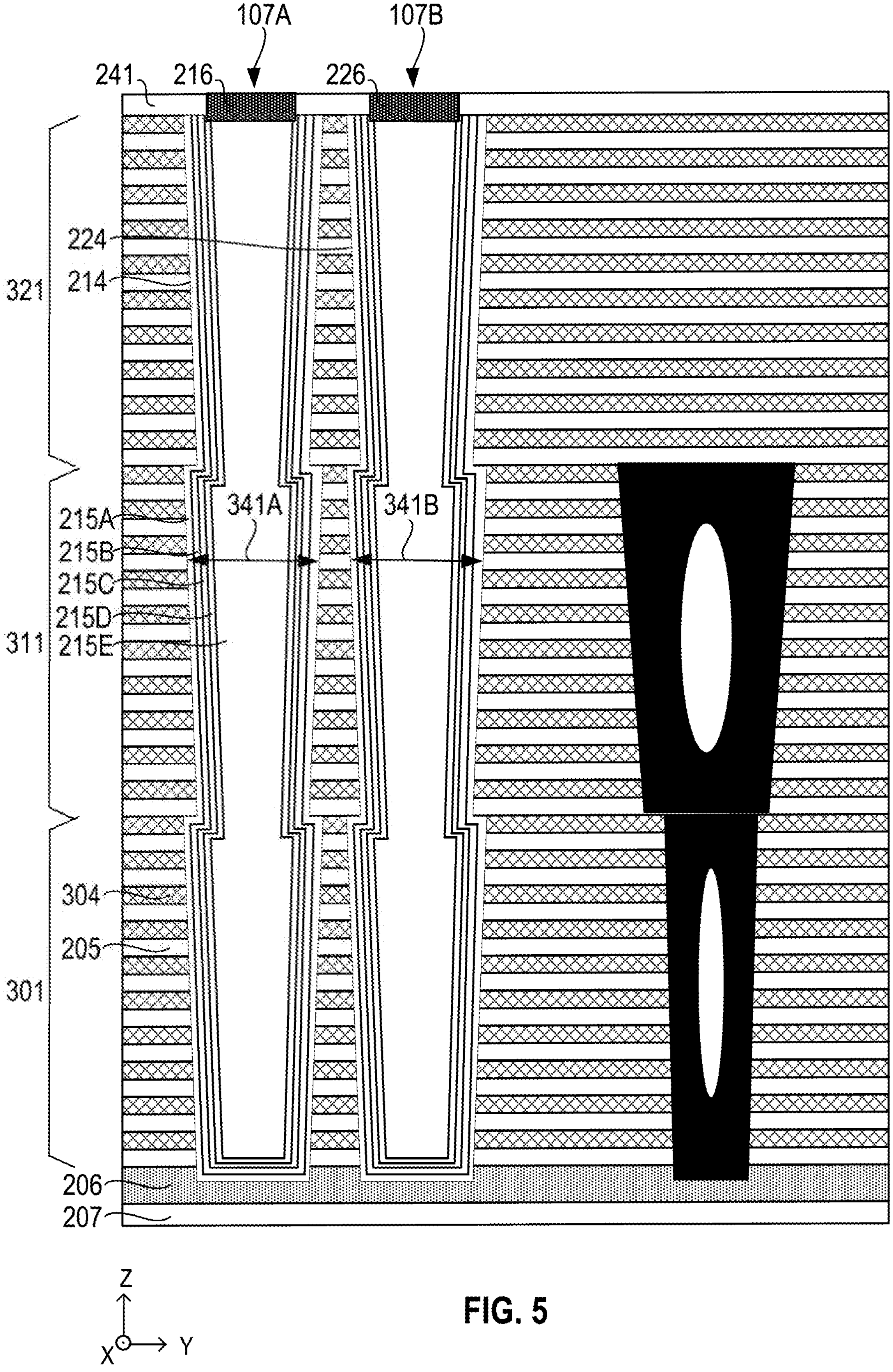

In FIG. 5, the channel structures 107A and 107B can be formed within the left-side opening 341A and the right-side opening 341B. In an embodiment, the blocking layer 215A, the charge trapping layer 215B, the tunneling layer 215C, and the channel layer 215D can be conformally and subsequently deposited over the sidewalls of the openings 341A/341B. The charge trapping layer 215B is sandwiched between the blocking layer 215A and the tunneling layer 215C. The core 215E can be formed within an opening surrounded by the channel layer 215D. A CMP process can be performed to remove the excessive materials located above the top surface of the deck 321. The cap layer 241 can be formed to cover the top surface of the deck 321. The channel contacts 216 and 226 can subsequently be formed through the cap layer 241 to connect to the channel layers 215D of the channel structures 107A/107B.

In some examples, staircase structures are employed in the contact region 101. In such a configuration, after the channel structures 107A/107B and the respective channel contacts 216/226 are formed, in some embodiments, various fabrication steps can be performed to form a staircase structure, word line contacts, and dummy channels in the staircase region 101.

In some examples, no staircase structures are used. Word line contacts (such as the word line contact 171) can be formed in the contact region. In some examples, formation of these word line contacts (without a staircase) can be postponed to a later stage when word line replacement and GLS structures have been completed.

Figure 6:
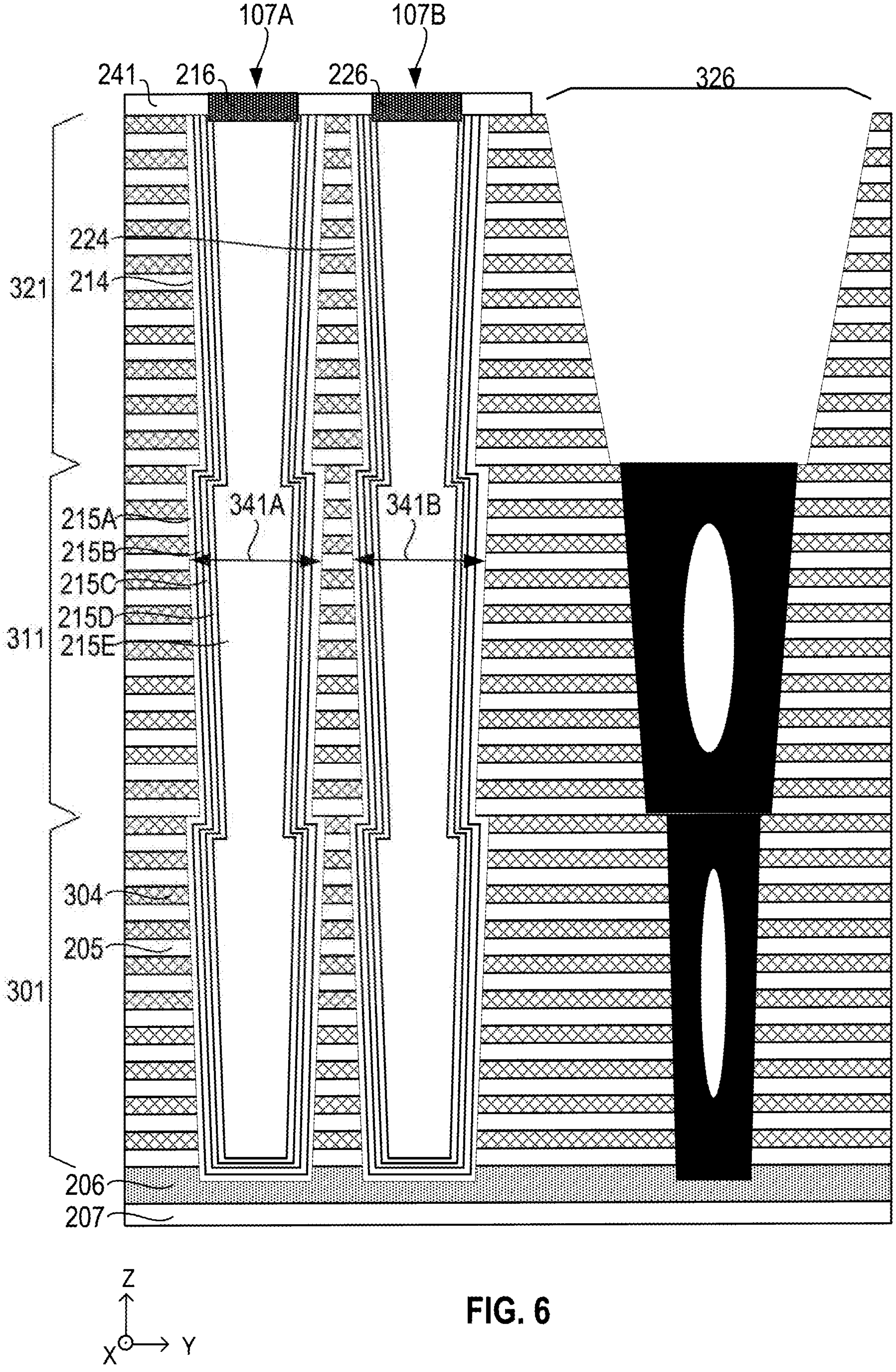

In FIG. 6, a GLS opening 326 is formed in the deck 321. The GLS opening 326 can be formed in a way similar to the opening 316 in the deck 311. In an embodiment, the bottom of the opening 326 is positioned at the top surface of the sacrificial layer 318 in the opening 316. The sacrificial layer 318 in the opening 316 (shown in FIG. 3) and the sacrificial layer 308 in the opening 306 can be removed. Sidewalls of the GLS openings 306, 316, and 326 can thus be exposed.

Figure 7:
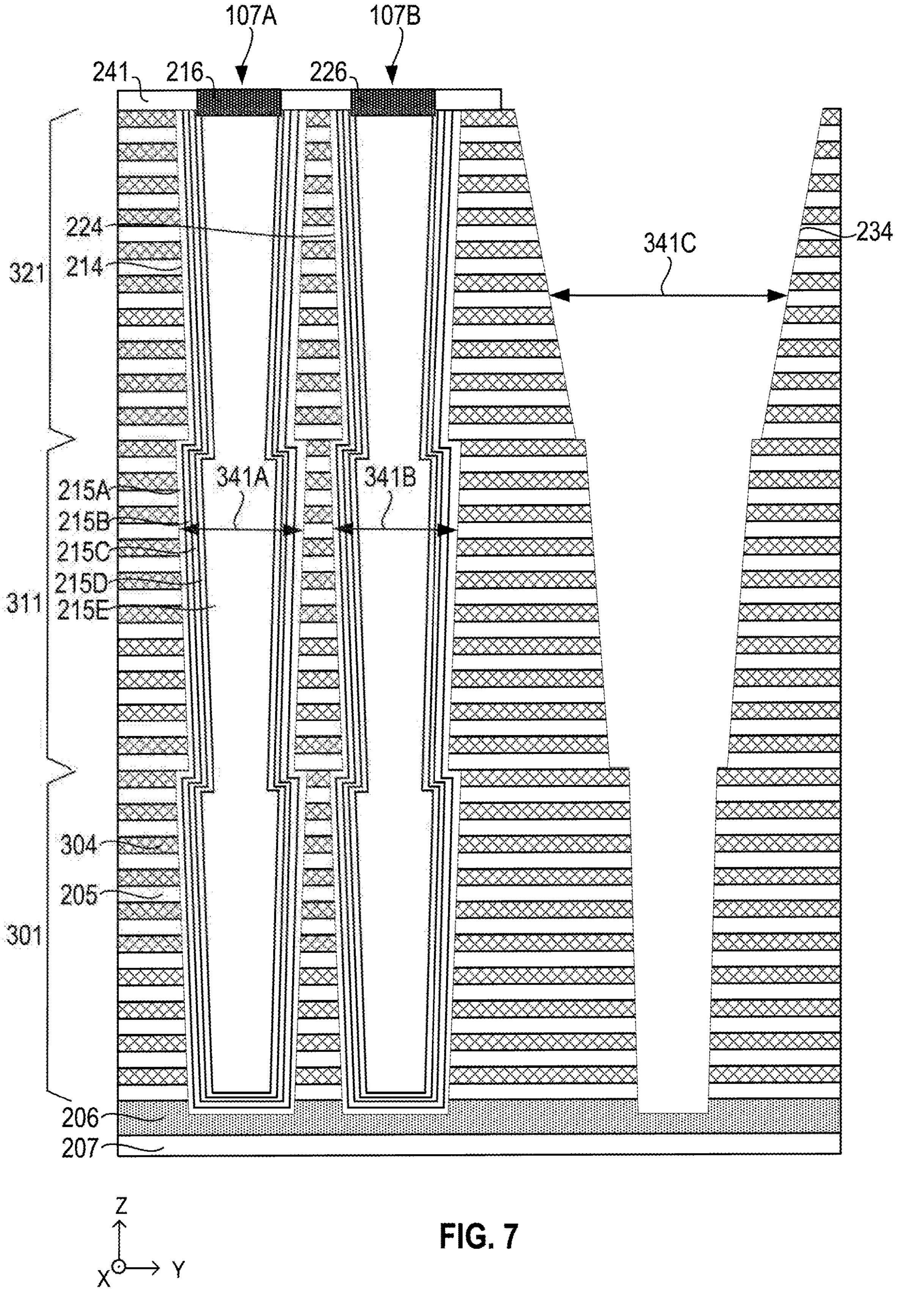

In FIG. 7, a multi-deck GLS opening 341C is shown crossing the decks 301/311/321. The multi-deck GLS opening 341C includes the GLS openings 306, 316, and 326 connected in series in the Z direction.

In subsequent steps of the fabrication process, the sacrificial layers 304 can be replaced with the word line layers 204 via the multi-deck GLS opening 341C. The multi-deck GLS opening 341C can then be closed up by filling with one or more materials. For example, the sacrificial layers 304 can be removed by an etching process, such as a wet etching process. In an example, tetramethylammonium hydroxide (TMAH) can be applied to selectively remove the sacrificial layers 304. When the sacrificial layers 304 are removed, spaces can be formed between the insulating layers 205. Sidewalls of the channel structures 107A/107B can be exposed in the spaces.

A conductive material, such as tungsten, can be deposited to fill the spaces between the insulating layers 205 to form the word line layers 204. Excessive conductive material outside the spaces between the insulating layers 205 and inside the multi-deck GLS opening 341C can be removed. In an example, a liner (e.g., TIN) can first be deposited inside the paces before filling the conductive material into the spaces.

A deposition process can be applied to deposit a dielectric material, such as SiO2, along the sidewall and the bottom of the multi-deck GLS opening 341C. The GLS 111 can subsequently be formed, for example, by filling a conductive or dielectric material into the opening inside the previously deposited dielectric material.

In the FIG. 1A example, partially replacing the sacrificial layers 304 in the area 151 and the area 153 can take place at different times. For example, GLS openings corresponding to the GLSs 111 and 112 at the transition region 104 and the contact region 101 may first be covered, for example, by filling a sacrificial material or a lithography mask. Then, the sacrificial layers 304 in the area 151 can be replaced with a metal via GLS openings that are not covered in the area 151. In a next step, the sacrificial layers 304 in the area 153 can be replaced. Or, the above order can be reversed. For example, replacement of the sacrificial layers 304 in the area 153 can be performed before the replacement of the sacrificial layers 304 in the area 151. The GLS openings corresponding to the GLSs 111-113 can then be filled to form the GLSs 111-113. Thereafter, the word line contacts 171 can be formed in the contact region 101.

In another example, a staircase may have been formed in the contact region 101. When replacing the sacrificial layers 304, a whole sacrificial layer 304 of each step can be replaced via GLS openings corresponding to the GLSs 111/112/113.

At the current stage, after the above processing steps described with reference to FIGS. 2-7, the device 100 shown in FIG. 1A and FIG. 1B is formed.

When the staircase structure is used in the contact region 101, for either the one-etch GLS method or the multi-etch GLS method, the GLS etch crosses an oxide layer (for example, including SiO2) formed above the staircase structure in addition to the alternating sacrificial layers and insulating layers. The Etch of channel structures crosses the alternating sacrificial layers and insulating layers. Merging the GLS etch with the channel structure etch can be relatively difficult because the etch process involves the oxide material. In contrast, for the configuration without the staircase structure, the GLSs and the channel structures cross the same stacking layers. Thus, merging the formation of these two types of structures can be relatively more feasible.

In addition, for the particular word line contact design in the example of FIG. 1A, more chip areas can be yielded to the GLS structures. Thus, the GLS 111 in FIG. 1B can have a wider top size. A wider GLS opening makes it easier to fill the GLS opening and makes the GLS structure stronger to better support the structure of the device 100.

In some embodiments, instead of using a GLS, a source line contact is formed at the contact region 101 to provide a conductive contact path for the source line at the bottom of the device 100. Such a source line contact crosses the N decks of the device 100. In combination with such a configuration, the risk of dielectric breakdown caused by the discontinuity of the multi-etch (multi-segment) GLS can be avoided.

In addition, when a GIS is used to provide a source line contact path, a spacer layer (e.g., SiO2) is formed to isolate a conductive core (e.g., polysilicon) from surrounding word line layers. The spacer layer structure imposes limitations on the size and shape of a GLS opening. In combination with the source line contact being formed in the contact region 101, the size and/or shape requirement to the multi-etch (multi-segment) GLS can be relaxed. In some examples, without the limitations of the spacer structure, the bottom of a GLS can be formed narrower.

FIGS. 8A-8G show structure enhancement solutions 801-807 according to some embodiments of the disclosure. In conventional fabrication methods for making N-deck 3D NAND memory devices, a GLS (e.g., a block-partition GLS or a finger-partition GLS) can be formed in a single etch process cutting through all the decks. Typically, a GLS can be continuous along the X direction in the storage region (core region) 102. The present disclosure provides a fabrication method where per-deck GLSs (or referred to as sub-GLSs) can be formed deck by deck. Based on such a GLS forming technique, different (or the same) sub-GLS distribution patterns (or layout patterns) along the X-direction can be used for different decks in the storage region (core region) 102. The combination of such distribution patterns of different decks provides a better support to the memory device structure such that an incline (a tilt) or a twist of fingers caused by mechanical stress can be avoided or reduced. Also, the sub-GLS distribution patterns in different decks can be flexibly configured, such that the combination of such distribution patterns can satisfy different mechanical stress requirements.

The device 100 with a different configuration of GLSs is used as an example to explain the enhancement solutions 801-807. Each of the FIGS. 8A-8G shows three cross-sectional views of the storage region (core region) 102 of the block 103 of the device 100 in FIG. 1A. For example, in each of the FIGS. 8A-8G, the first cross-sectional view (denoted Deck 1) corresponds to a cut plane passing a topmost word line layer of the bottom deck 201. The second cross-sectional view (denoted Deck 2) corresponds to a cut plane passing a topmost word line layer of the middle deck 202. The third cross-sectional view (denoted Deck 3) corresponds to a cut plane passing a topmost word line layer of the upper deck 203.

Each cross-sectional view (or Deck) in the FIGS. 8A-8G is bounded by an upper block-partition GLS and a lower block-partition GLS. For each cross-sectional view (or deck) in the FIGS. 8A-8G, two finger-partition GLSs (e.g., in Deck 1) or two sequences of finger-partition GLSs (e.g., in Deck 2 and Deck 3) are evenly distributed between the upper block-partition GLS and the lower block-partition GLS and partition the block 103 into two fingers. Channel structures 802 are positioned between finger-partition GLSs or between finger-partition GLSs and block-partition GLSs. The two finger-partition GLSs or two sequences of finger-partition GLSs each are positioned at a border between the two finger structures. In this disclosure, a single finger-partition GLS (e.g., GLS 811 or 812 in FIG. 8A) in the storage region 102 is considered to be a particular form of a sequence of per-deck GLSs. Also, a sequence of finger-partition GLSs (or GLS structures) can also, as a whole, be referred to as a finger-partition GLS in some scenarios. Such a finger-partition GLS can include a sequence of finger-partition GLSs (or GLS structures).

Each GLS shown in FIGS. 8A-8G extends in an X-Z plane and crosses the respective deck. The GLSs in Deck 1, Deck 2, or Deck 3 can be formed in a similar way to the per-deck sub-GLS 231, 232, or 233, respectively. For example, for each of Deck 1 and Deck 2, a same lithography mask and a same etch process can be shared to form the channel structures and the GLSs. The lithography mask can have a pattern similar to the pattern of Deck 1 or Deck 2. In a cross-section corresponding to a Y-Z, plane passing the sequences of the one or more GLSs of the three decks, a profile of a multi-deck GLS is discontinuous at a border between two adjacent decks. The multi-deck GLS can include portions of per-deck sub-GLSs each corresponding to the respective sequence of the one or more GLSs in the respective deck.

Figure 8A:
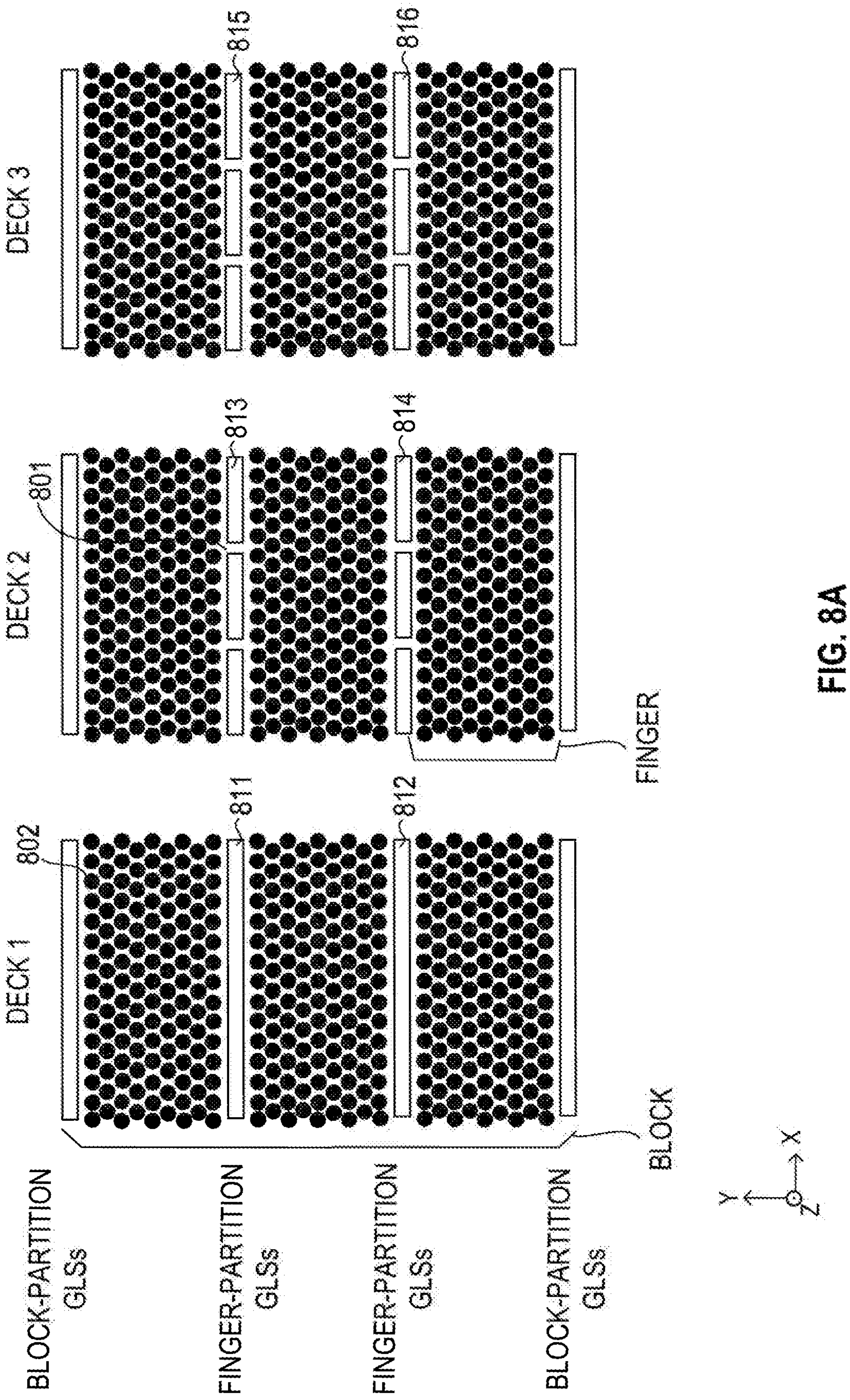
FIGS. 8A-8G show structure enhancement solutions 801-807 according to some embodiments of the disclosure.

In FIG. 8A, Deck 1 has two finger-partition GLSs 811-812 each continuously formed along the X direction. Deck 2 has two sequences of finger-partition GLSs 813-814. Each sequence 813 or 814 includes three finger-partition GLSs that are discontinuously arranged in the X direction. Deck 3 has two sequences of finger-partition GLSs 815-816. Each sequence 815 or 816 includes three finger-partition GLSs that are discontinuously arranged in the X direction. As shown, Deck 2 and Deck 3 are adjacent and have a same finger-partition GLSs distribution pattern that is different from that of Deck 1. It is noted that, although a finger-partition GLS (or GLS structure) (such as the GLS 813-816) is shown to include three sub-GLSs (or sub-GLS structures) in the examples of FIGS. 8A-8B, a finger-partition GLS can include any number of sub-GLSs. For example, the number can be 1, 2, 4, 10, 20, 50, 100, 300, 1000, 2000, or the like.

The sequence 813/814/815/816 of finger-partition GLSs can be considered to be a single GLS being cut into three GLSs. The "cut" 801 as shown in FIG. 8A can have a shape of H rotating 90 degrees. Thus, the cuts 801 are referred to as H-cuts 801 where the sequence of finger-partition GLSs is not continuous. By referencing H-cuts, a GLS distribution pattern along the X-direction in a deck can be characterized by the positions of the H-cuts, if existing, in the respective sequence of per-deck GLSs. In an X-Z plane passing a finger-partition GLS in each deck, the structure at each H-cut position that separate two neighboring sub-GLSs can include alternating sacrificial layers and insulating layers (before the sacrificial layers being replaced with word line layers) or alternating word line layers and insulating layers (after the sacrificial layers being replaced with word line layers).

In each of the examples of FIGS. 8A-8G, finger-partition GLSs with H-cuts are used in one or more decks. An H-cut structure connects two portions of a same stacking layer at opposite sides of a sequence of finger-partition GLSs, thus enhancing the structure of the memory device 100 compared with using continuous finger-partition GLS. During the processing steps of forming GLSs in each deck, removing sacrificial layers, and forming word line layers, the H-cut structures can prevent or reduce the adverse effects (e.g., structural distortion) caused by internal mechanical stresses upon finger structures.

In addition, different decks can be configured with different (or same) GLS distribution patterns (characterized by the number and locations of the H cuts). By combining different GLS distribution patterns of the finger-partition GLSs in different decks, the adverse effects caused by the mechanical stresses can be further reduced.

Figure 8B:
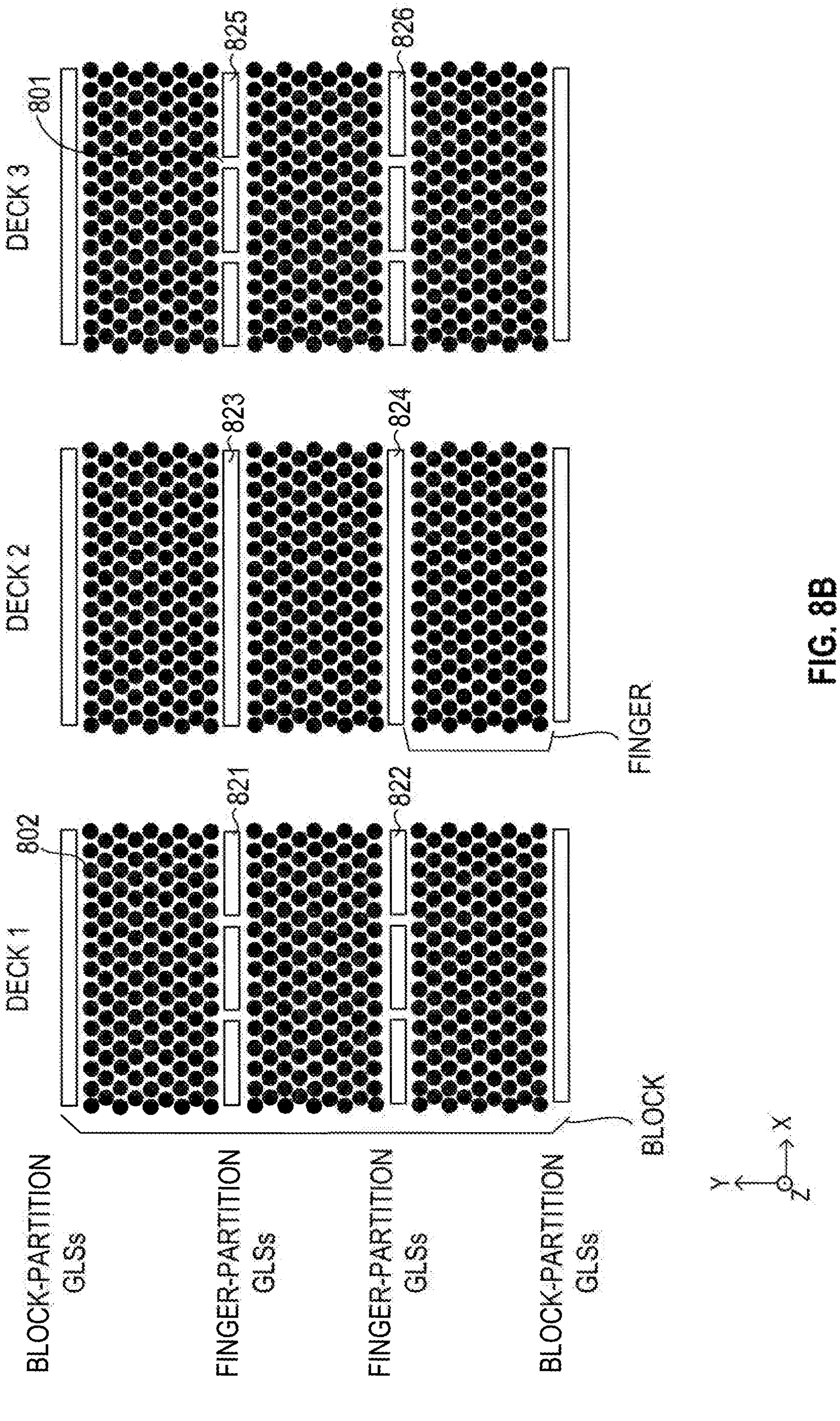

In FIG. 8B, Deck 1 has two sequences of discontinuous finger-partition GLSs 821-822. Deck 2 has two continuous finger-partition GLSs 823-824. Deck 3 has two sequences of discontinuous finger-partition GLSs 825-826. As shown, Deck 1 and Deck 3 are nonadjacent and have a same finger-partition GLSs distribution pattern that is different from that of Deck 2. Also, the sequences of the one or more GLSs of any two adjacent decks have different distribution patterns along the X direction.

Figure 8C:
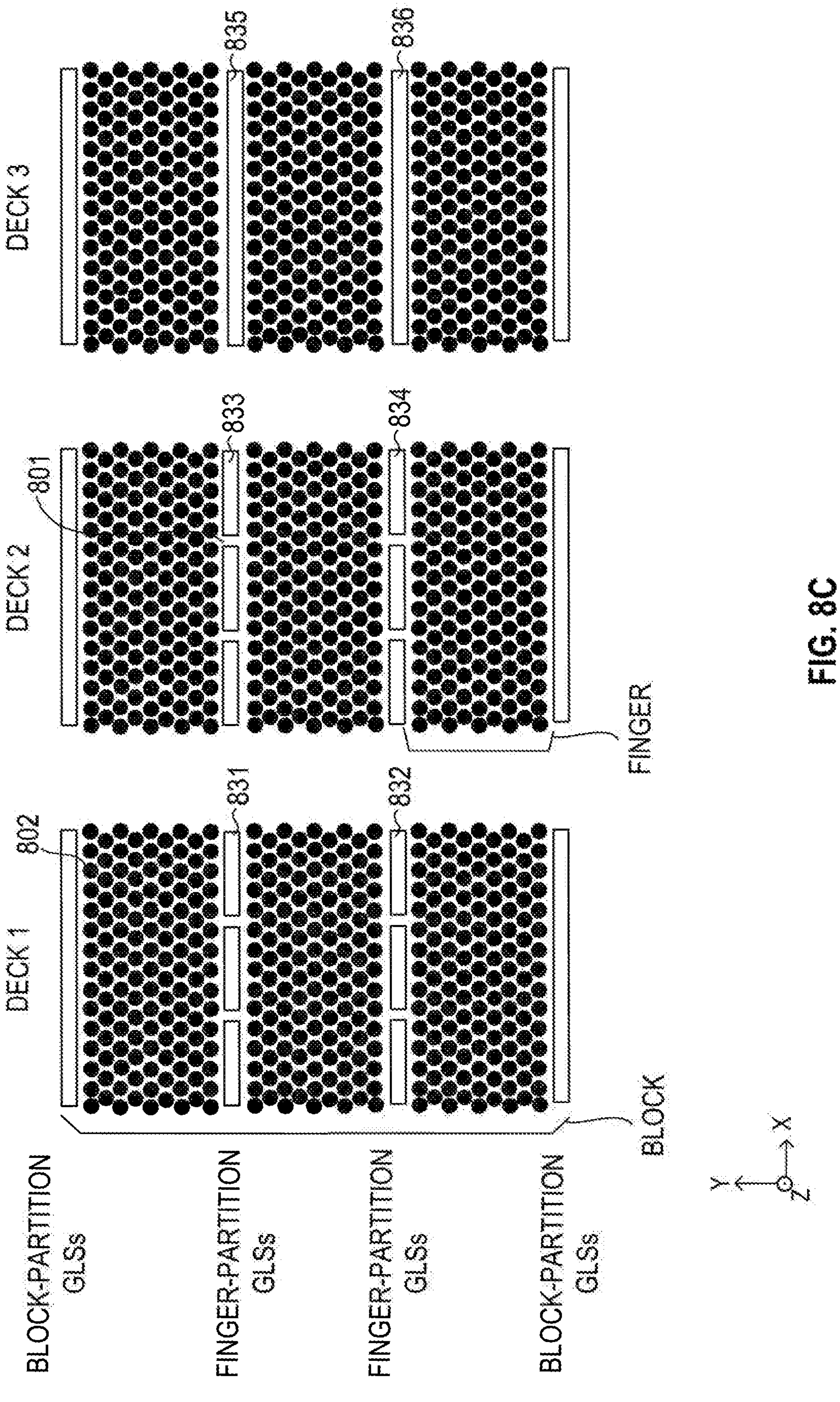

In FIG. 8C, Deck 1 has two sequences of discontinuous finger-partition GLSs 831-832. Deck 2 has two sequences of discontinuous finger-partition GLSs 833-834. Deck 3 has two continuous finger-partition GLSs 835-836. As shown, Deck 1 and Deck 2 have a same finger-partition GLSs distribution pattern that is different from that of Deck 3.

Figure 8D:
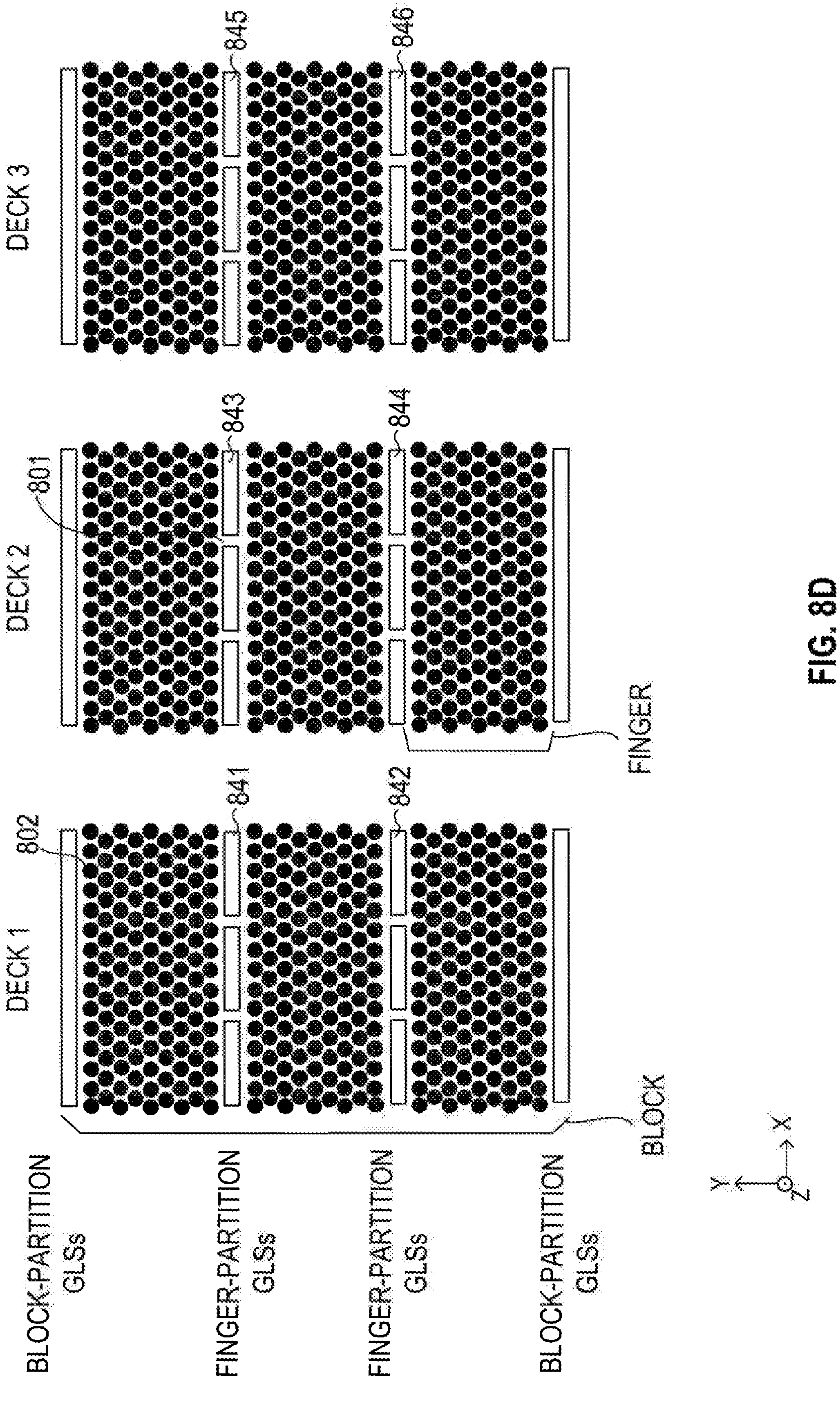

In FIG. 8D, each deck has two sequences of discontinuous finger-partition GLSs among the six sequences of discontinuous finger-partition GLSs 841-846. Deck 1, Deck 2, and Deck 3 have a same finger-partition GLSs distribution pattern. In some examples, different from FIG. 8D, the sequences of the finger-partition GLSs in a same X-Z plane for any two adjacent decks are arranged in a staggered manner. In other words, the H-cuts of any two adjacent decks in a same X-Z plane are staggered or misaligned. For example, no H-cuts of any two adjacent decks in a same X-Z plane are aligned. Any two adjacent decks have two different finger-partition GIS distribution patterns (characterized by the positions of the H-cuts).

Figure 8E:
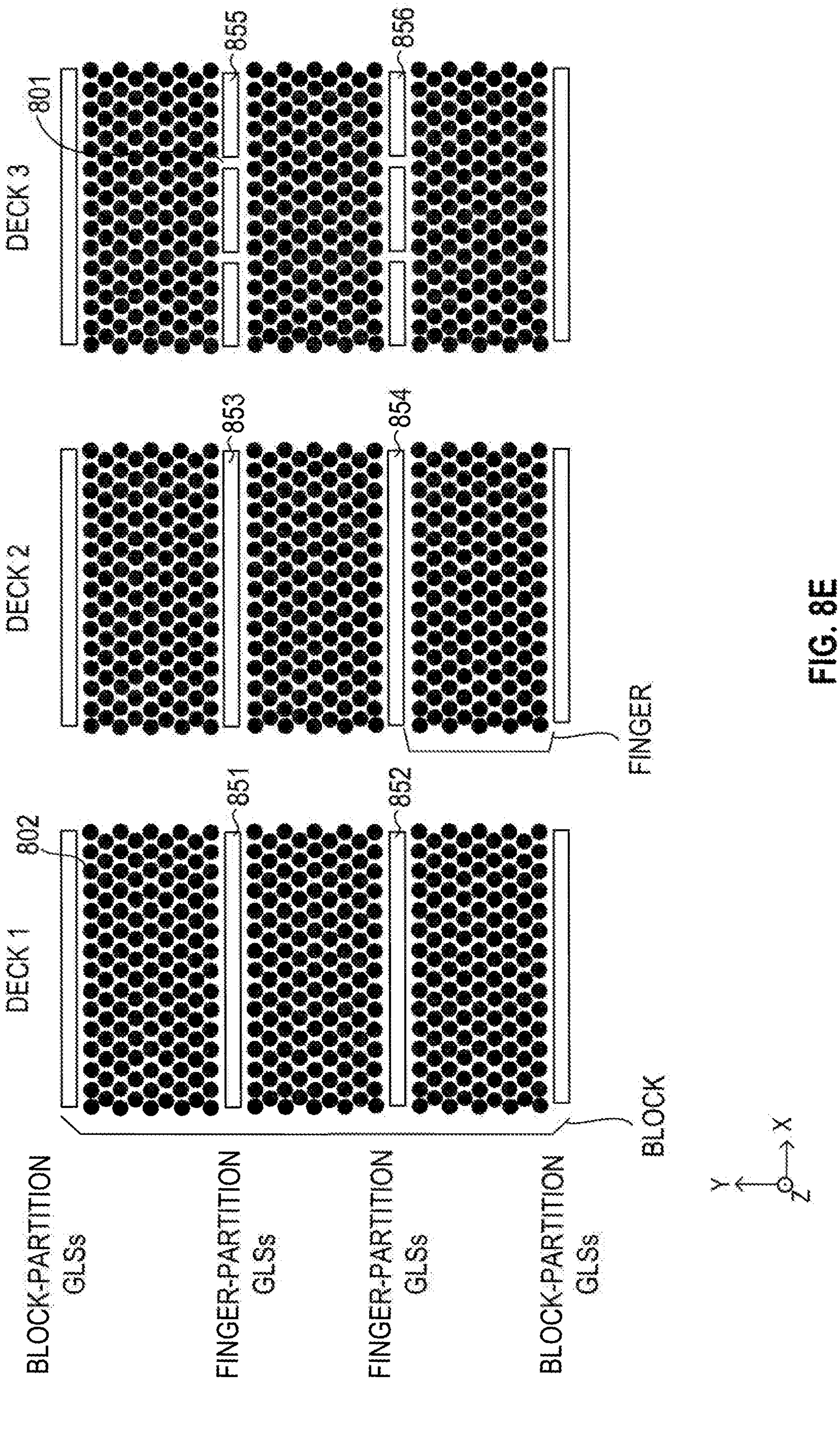

In each of the FIGS. 8E/8F/SG, one deck has two sequences of discontinuous finger-partition GLSs, and two decks each have two continuous finger-partition GLSs. Specifically, in FIG. 8E, Deck 1 has two continuous finger-partition GLSs 851-852. Deck 2 has two continuous finger-partition GLSs 853-854. Deck 3 has two sequences of discontinuous finger-partition GLSs 855-856. As shown, Deck 1 and Deck 2 have a same finger-partition GLSs distribution pattern that is different from that of Deck 3.

Figure 8F:
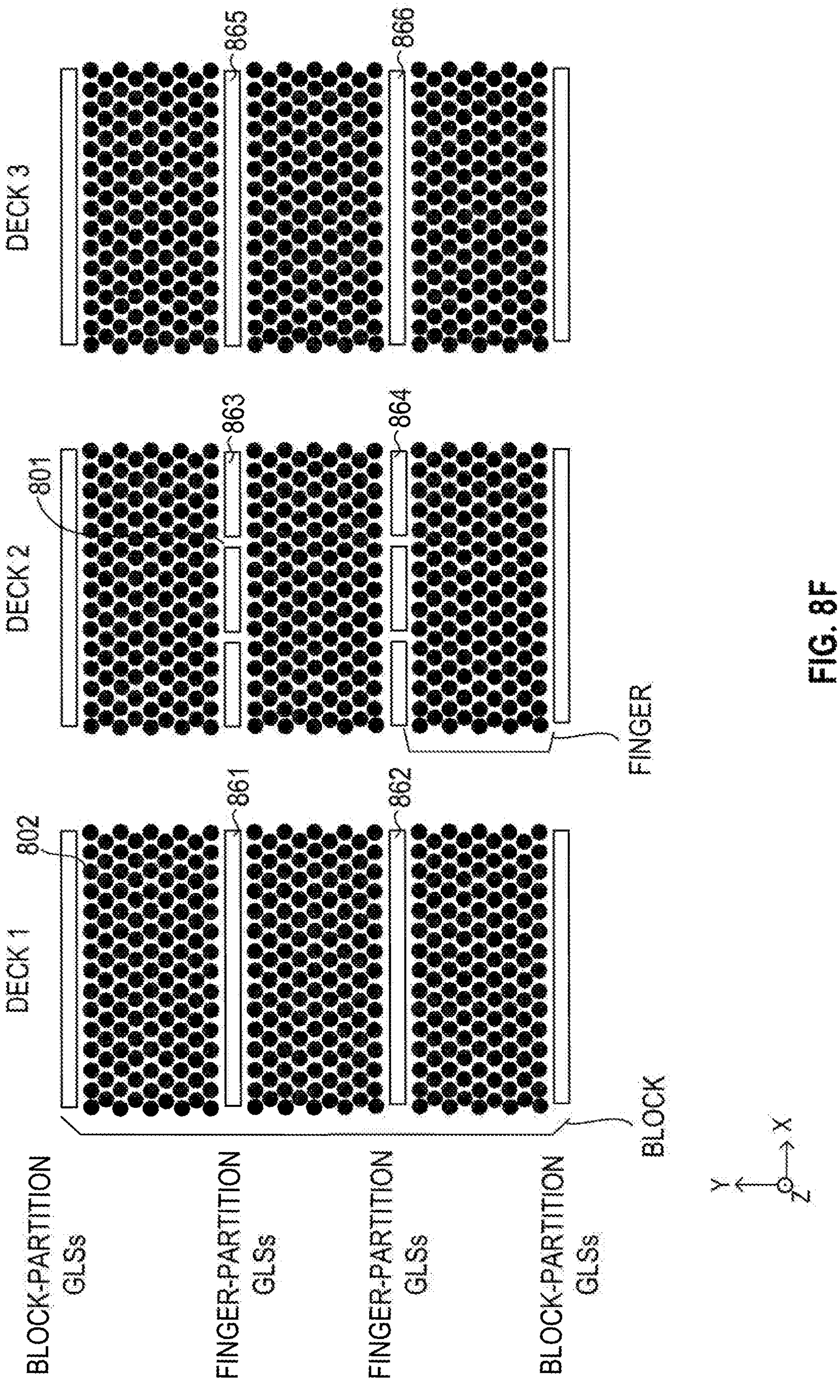

In FIG. 8F, Deck 1 has two continuous finger-partition GLSs 861-862. Deck 2 has two sequences of discontinuous finger-partition GLSs 863-864. Deck 3 has two continuous finger-partition GLSs 865-866. As shown, Deck 1 and Deck 3 have a same finger-partition GLSs distribution pattern that is different from that of Deck 2. Also, the sequences of the one or more finger-partition GLSs of any two adjacent decks have different distribution patterns along the X direction.

Figure 8G:
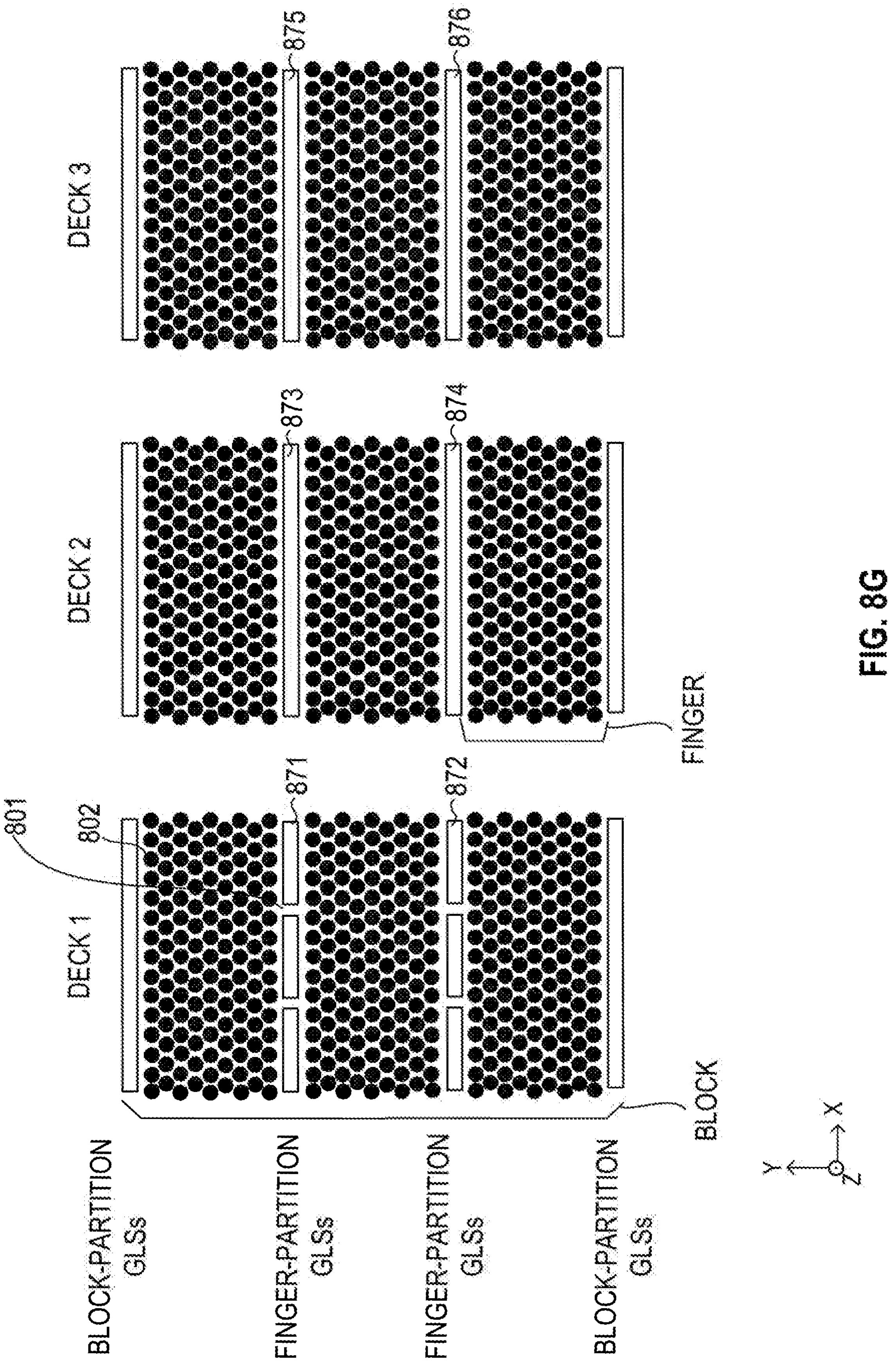

In FIG. 8G, Deck 1 has two sequences of discontinuous finger-partition GLSs 871-872. Deck 2 has two continuous finger-partition GLSs 873-874. Deck 3 has two continuous finger-partition GLSs 875-876. As shown, Deck 2 and Deck 3 have a same finger-partition GLSs distribution pattern that is different from that of Deck 1.

While the two sequences of finger-partition GLSs in each deck in FIGS. 8A-8G are shown to have the same sub-GLS distribution pattern along the X direction, the two sequences in each deck can have different distribution patterns in other examples. Also, in some examples, there can be N number of decks, where N can be more than 3, such as 4, 5, 7, 10, and the like. Every deck among N number of decks can use a different distribution pattern for the sequences of finger-partition GLSs of each deck in a same X-Z plane. In some examples, among the N number of decks, at least one deck includes at least one finger-partition GLS (or GLS structure) that includes at least two sub-GLSs (or sub-GLS structures).

Figure 9:
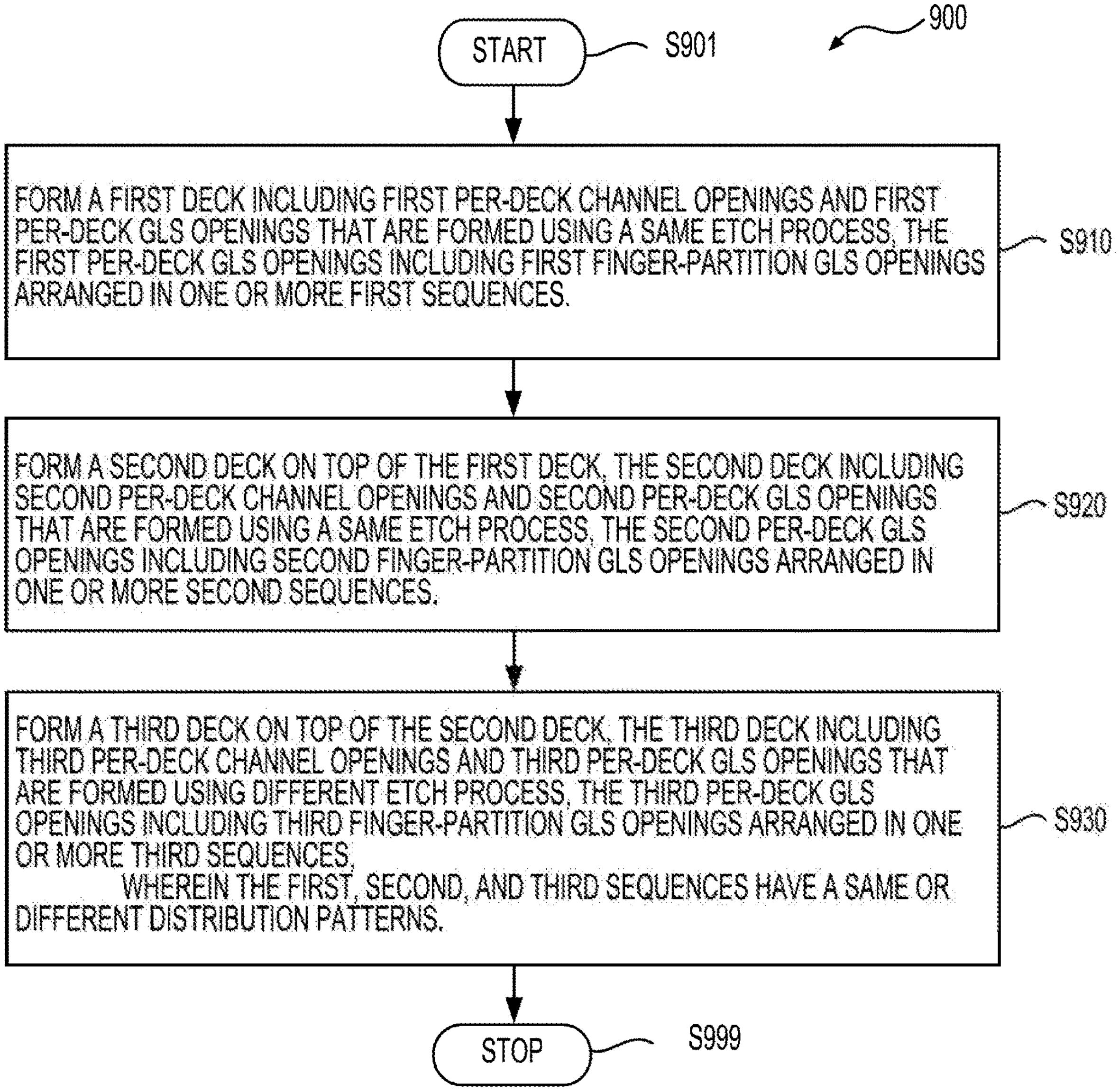
FIG. 9 is a flowchart of a fabrication process 900 for making a 3D NAND memory device according to embodiments of the disclosure.

FIG. 9 is a flowchart of a fabrication process 900 for making a 3D NAND memory device according to embodiments of the disclosure. The 3D NAND memory device can include three decks. The process 900 can start from S901 and proceed to S910.

At S910, a first deck is formed. For example, a first stack of alternating sacrificial layers and insulating layers can be formed over a substrate. By a first merged etch process, first per-deck channel openings and first per-deck GLS openings can be formed and filled with a sacrificial material. The first per-deck GLS openings can include first finger-partition GLS openings. The first finger-partition GLS openings can be arranged into one or more first sequences each corresponding to an X-Z plane. The first sequences can each have a first sub-GLS distribution pattern along the X direction.

At S920, a second deck is formed on top of the first deck. For example, a second stack of alternating sacrificial layers and insulating layers can be formed over the first deck. By a second merged etch process, second per-deck channel openings and second per-deck GLS openings can be formed and filled with a sacrificial material. The second per-deck GLS openings can include second finger-partition GLS openings. The second finger-partition GLS openings can be arranged into one or more second sequences. Each second sequence corresponds to a first sequence in the first deck and extend in the same X-Z plane as the respective first sequence. The second sequences can each have a second sub-GLS distribution pattern along the X direction.

At S930, a third deck is formed on top of the second deck. For example, a third stack of alternating sacrificial layers and insulating layers can be formed over the second deck. The third deck includes third per-deck channel openings and third per-deck GLS openings that are formed using different etch processes.

For example, the third per-deck channel openings can be formed. Through the third per-deck channel openings, the sacrificial material is removed from the first per-deck channel openings and the second per-deck channel openings. As a result, multi-deck channel openings can be formed. Each multi-deck channel opening includes a first per-deck channel opening, a second per-deck channel opening, and a third per-deck channel opening that are concatenated in the Z direction. Channel structures can subsequently be formed in the multi-deck channel openings.

Next, third per-deck GLS openings can be formed by another etch process. Via the third per-deck GLS openings, the sacrificial material can be removed from the first per-deck GLS openings and the second per-deck openings. As a result, multi-deck GLS openings can be formed.

The third per-deck GLS openings can include third finger-partition GLS openings. The third finger-partition GLS openings can be arranged into one or more third sequences. Each third sequence corresponds to a previously formed first sequence in the first deck and a previously formed second sequence in the second deck. Each third sequence extends in the same X-Z plane as the respective first sequence and the respective second sequence. The third sequences can each have a third sub-GLS distribution pattern along the X direction.

The first, second, and third sequences of finger-partition GLS openings may have a same or different distribution patterns along the X direction. For example, the distribution patterns of the first, second, and third sequences of finger-partition GLS openings can be similar to the distribution patterns of per-deck sub-GLSs of Deck 1, Deck 2, and Deck 2, respectively, in the FIGS. 8A-8G.

A multi-deck GLS opening in a cress-section passing a Y-Z plane that cuts through the three decks of the 3D NAND memory device can include a first per-deck GLS opening, a second per-deck GLS opening, and a third per-deck GLS opening that are concatenated in the Z direction.

Next, based on the per-deck GLS openings in the three decks, replacement of sacrificial layers with conductive materials can be performed to form word line layers. In some examples, no staircase structures are used. Separate processes for the replacement may be performed in the storage region and the contact region of the 3D NAND memory. In the contact region, areas close to the GLS openings are replaced with the conductive material to form a conductive path connecting the storage region and the contact region. For areas far away from the GLS openings, the original sacrificial layers remain. Word line contacts can subsequently be formed each crossing the remaining sacrificial layers to reach a target word line layer.

After the replacement processing, the GLS openings can be filled, for example, by a combination of an isolation layer on the sidewalls and a core surrounded by the isolation layer. As a result, the per-deck sub-GLSs in each deck can be formed. The process 900 can proceed to S999 and terminate at S999.

It should be noted that additional steps can be provided before, during, and after the process 900, and some of the steps described can be replaced, eliminated, or performed in a different order for additional embodiments of the process 900. For example, in an N-deck configuration, any number of decks can be employed in the 3D NAND memory device. Accordingly, between S920 and S930, there can be additional steps performed to form additional decks having channel openings and per-deck GLS openings.

In subsequent process steps, various additional interconnect structures (e.g., metallization layers having conductive lines and/or vias) or periphery structures may be formed over the 3D NAND memory device. The periphery structures can form control circuitry to operate the device 3D NAND memory device. The interconnect structures can electrically connect the 3D NAND memory device with the periphery structures of other contact structures and/or active devices to form functional circuits. Additional device features such as passivation layers, input/output structures, and the like may also be formed.

Figure 10:
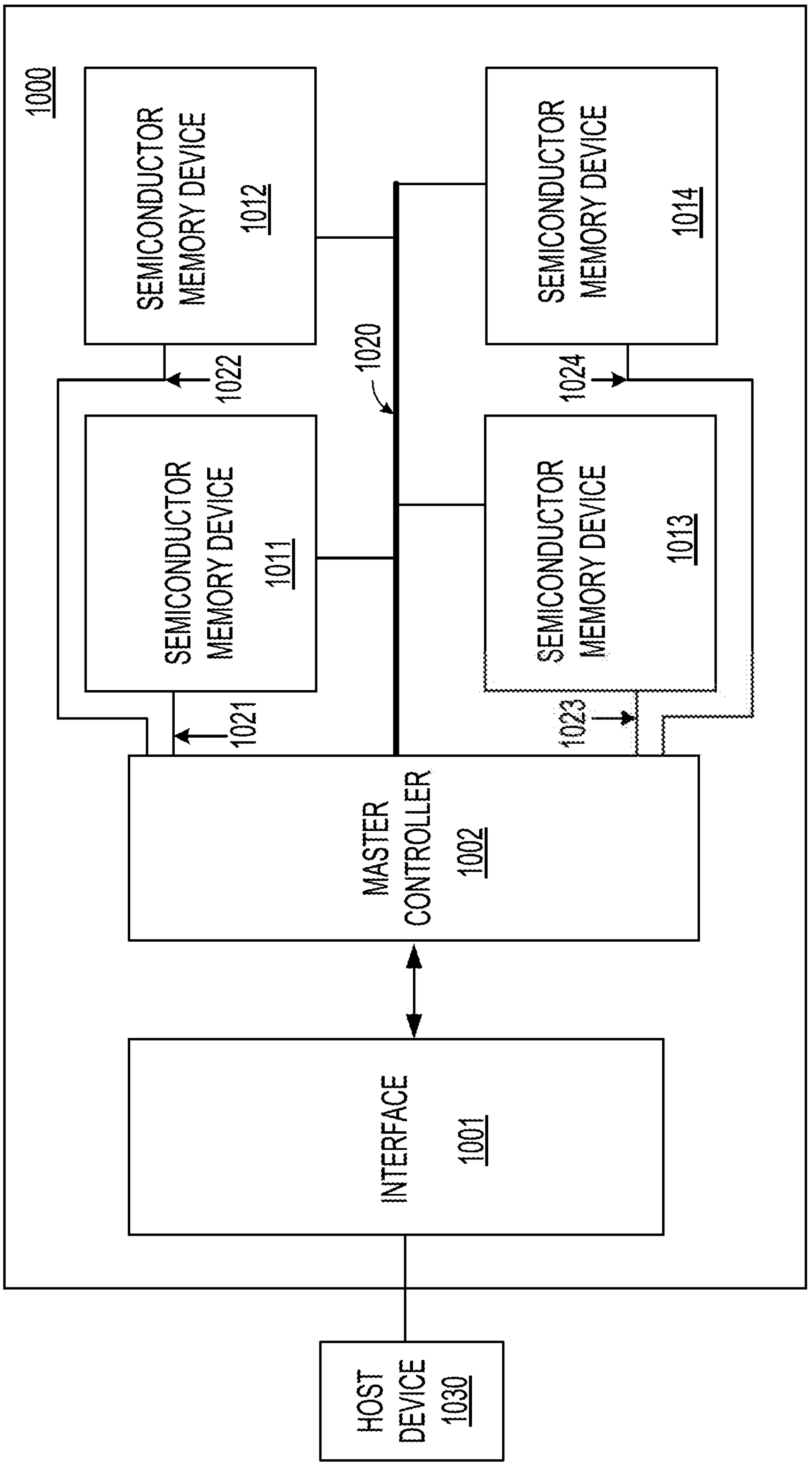
FIG. 10 shows a block diagram of a memory system device 1000 according to some examples of the disclosure.

FIG. 10 shows a block diagram of a memory system device 1000 according to some examples of the disclosure. The memory system device 1000 includes one or more semiconductor memory devices 1011-1014, which can be similar to the memory device 100. In some examples, the memory system device 1000 is a solid-state drive (SSD) or a memory module.

The memory system device 1000 can include other suitable components. For example, the memory system device 1000 includes an interface (or master interface circuitry) 1001 and a master controller (or master control circuitry) 1002 coupled together as shown in FIG. 10. The memory system device 1000 can include a bus 1020 that couples the master controller 1002 with the semiconductor memory devices 1011-1014. In addition, the master controller 1002 is connected with the semiconductor memory devices 1011-1014 through control lines 1021-1024.

The interface 1001 is suitably configured mechanically and electrically to connect between the memory system device 1000 and a host device 1030. The interface 1001 can be used to transfer data between the memory system device 1000 and the host device 1030.

The master controller 1002 is configured to connect the respective semiconductor memory devices 1011-1014 to the interface 1001 for data transfer. For example, the master controller 1002 is configured to provide enable/disable signals respectively to the semiconductor memory devices 1011-1014 to activate one or more semiconductor memory devices 1011-1014 for data transfer.

The master controller 1002 provides functions for the completion of various instructions within the memory system device 1000. For example, the master controller 1002 can perform bad block management, error checking and correction, garbage collection, and the like. In some embodiments, the master controller 1002 is implemented using a processor chip. In some examples, the master controller 1002 is implemented using multiple master control units (MCUs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

N number of decks that are stacked up in a Z direction and extend in parallel with an X-Y plane, N being an integer greater than 1, the X-Y plane being perpendicular to the Z direction and having an X direction and a Y direction perpendicular to the X direction, each deck including alternating word line layers and insulating layers; and channel structures vertically in the Z direction formed and crossing the word line layers, wherein each deck includes two first gate line slit (GLS) structures and a second GLS structure positioned between the two first GLS structures, the two first GLS structures and the second GLS structures each extending in an X-Z plane and cutting through the word line layers and the insulating layers of the respective deck, at least one second GLS structure of at least one deck in the N Number of decks including multiple sub-GLS structures, the multiple sub-GLS structures being separate from each other, and the second GLS structures of each deck forms a multi-deck GLS structure, the multi-deck GLS structure having a first sidewall in a first deck of the N number of decks, a second sidewall in a second deck of the N number of decks, and a third sidewall at a border between the first deck and the second deck neighboring the first deck, an upper edge of the first sidewall and a lower edge of the second sidewall being staggered, the third sidewall connecting the first sidewall and the second sidewall, wherein the second GLS structures of at least two adjacent decks among the N number of decks have different numbers of distribution patterns along the X direction, each of the different distribution patterns being characterized by a respective distribution of respective separate sub-GLS structures included in the respective second GLS structure of the at least two adjacent decks, and the second GLS structures between adjacent decks vary morphologically.

2. The semiconductor device of claim 1, the second GLS structure of each deck is located in a storage region of the semiconductor device where memory cell strings each along one of the channel structures are positioned.

3. The semiconductor device of claim 1, wherein the second GLS structure of each deck has a same distribution pattern along the X direction, the distribution pattern being characterized by a distribution of separate sub-GLS structures included in the second GLS structure of each deck along the X direction.

4. The semiconductor device of claim 1, wherein the second GLS structures of at least two adjacent decks among the N number of decks have a same distribution pattern along the X direction.

5. The semiconductor device of claim 1, wherein the second GLS structures of at least two nonadjacent decks among the N number of decks have a same distribution pattern along the X direction.

6. The semiconductor device of claim 1, wherein the second GLS structures of any two adjacent decks among the N number of decks have different distribution patterns along the X direction.

7. The semiconductor device of claim 1, wherein the two first GLS structures of the N number of decks define a block structure between the two first GLS structures of the N number of decks, and the second GLS structures of the N number of decks define a border between two finger structures in the block structure.

8. The semiconductor device of claim 1, wherein a width at a top of a lower one of two neighboring second GLS structures of two neighboring decks is smaller than a width at a bottom of an upper one of the two neighboring second GLS structures of the two neighboring decks in a cross-section corresponding to a Y-Z plane passing the multi-deck GLS structure.

9. The semiconductor device of claim 1, wherein a width at a top of a lower one of two neighboring second GLS structures of two neighboring decks is larger than a width at a bottom of an upper one of the two neighboring second GLS structures of the two neighboring decks in a cross-section corresponding to a Y-Z plane passing the multi-deck GLS structure.

10. The semiconductor device of claim 1, wherein two second GLS structures of two adjacent decks among the N number of decks have a first distribution pattern and a second distribution, respectively, along the X direction, the first distribution including sub-GLS structures separate at first positions, the second distribution including sub-GLS structures separate at second positions, the first positions and the second positions being staggered.

11. The semiconductor device of claim 4, wherein the second GLS structure of a first one of the at least two adjacent decks among the N number of decks has one sub-GLS structure, and the second GLS structure of a second one of the at least two adjacent decks among the N number of decks has three sub-GLS structures.

12. The semiconductor device of claim 5, wherein each of the second GLS structures of the at least two adjacent decks among the N number of decks has three sub-GLS structures.

13. The semiconductor device of claim 5, wherein each of the second GLS structures of three adjacent decks among the N number of decks has a same distribution pattern along the X direction.

14. The semiconductor device of claim 13, wherein each of the second GLS structures of the three adjacent decks among the N number of decks has three sub-GLS structures.

15. The semiconductor device of claim 6, wherein the second GLS structure of a first one of the any two adjacent decks among the N number of decks has one sub-GLS structure, and the second GLS structure of a second one of the any two adjacent decks among the N number of decks has three sub-GLS structures.

16. The semiconductor device of claim 1, wherein the channel structures each include a core.

17. The semiconductor device of claim 16, wherein the channel structures each further include a channel layer that surrounds the core.

18. The semiconductor device of claim 17, wherein the channel structures each further include a tunnel layer that surrounds the channel layer.

19. The semiconductor device of claim 18, wherein the channel structures each further include a charge trap layer that surrounds the tunnel layer.

20. The semiconductor device of claim 19, wherein the channel structures each further include a barrier layer that surrounds the charge trap layer.

* * * * *